United States Patent
Varpula et al.

(10) Patent No.: US 10,495,514 B2
(45) Date of Patent: Dec. 3, 2019

(54) MIRROR PLATE FOR A FABRY-PEROT INTERFEROMETER AND A FABRY-PEROT INTERFEROMETER

(71) Applicant: Teknologian tutkimuskeskus VTT Oy, Espoo (FI)

(72) Inventors: Aapo Varpula, Vtt (FI); Mika Prunnila, Vtt (FI); Kestutis Grigoras, Vtt (FI)

(73) Assignee: TEKNOLOGIAN TUTKIMUSKESKUS VTT OY, Espoo (FI)

( * ) Notice: Subject to any disclaimer, the term of this patent is extended or adjusted under 35 U.S.C. 154(b) by 126 days.

(21) Appl. No.: 15/556,662

(22) PCT Filed: Mar. 8, 2016

(86) PCT No.: PCT/FI2016/050139
§ 371 (c)(1),
(2) Date: Sep. 8, 2017

(87) PCT Pub. No.: WO2016/142583
PCT Pub. Date: Sep. 15, 2016

(65) Prior Publication Data
US 2018/0052049 A1 Feb. 22, 2018

(30) Foreign Application Priority Data
Mar. 9, 2015 (FI) ....................... 20155151

(51) Int. Cl.
*G01J 3/26* (2006.01)
*G01J 3/45* (2006.01)
(Continued)

(52) U.S. Cl.
CPC .................. *G01J 3/26* (2013.01); *G01B 9/02* (2013.01); *G01B 9/02018* (2013.01);
(Continued)

(58) Field of Classification Search
CPC .... G01J 3/26; G01J 1/0414; G01J 3/45; G01J 2003/2879; G02B 5/0816; G02B 26/0841;
(Continued)

(56) References Cited

U.S. PATENT DOCUMENTS 5,525,828 A 6/1996 Bassous et al.
5,799,028 A * 8/1998 Geels ...................... H01L 33/44
372/49.01
(Continued)

FOREIGN PATENT DOCUMENTS

CN 1619295 A 5/2005
CN 104062700 A 9/2014
(Continued)

OTHER PUBLICATIONS

Tunable Optical Filter of Porous Silicon as Key Component for a MEMS Spectrometer, Journal of Microelectromechanical Systems, vol. 11, No. 6, Dec. 2002, Gerhard Lammel, Sandra Schweizer, pp. 815-827.
(Continued)

*Primary Examiner* — Farhana A Hoque
(74) *Attorney, Agent, or Firm* — Ziegler IP Law Group, LLC

(57) ABSTRACT

A method for producing a mirror plate for a Fabry-Perot interferometer includes
  providing a substrate, which includes silicon,
  implementing a semi-transparent reflective coating on the substrate,
  forming a passivated region in and/or on the substrate by etching a plurality of voids in the substrate, and by passivating the surfaces of the voids,
  forming a first sensor electrode on top of the passivated region, and
(Continued)

forming a second sensor electrode supported by the substrate.

20 Claims, 21 Drawing Sheets

(51) Int. Cl.
G02B 5/08 (2006.01)
G01B 9/02 (2006.01)
G01J 1/04 (2006.01)
H01L 21/02 (2006.01)
H01L 21/20 (2006.01)
G02B 26/08 (2006.01)
G01J 3/02 (2006.01)
B81B 7/00 (2006.01)
G02B 5/28 (2006.01)
G01J 3/28 (2006.01)

(52) U.S. Cl.
CPC ........... *G01J 1/0414* (2013.01); *G01J 3/0278* (2013.01); *G01J 3/45* (2013.01); *G02B 5/08* (2013.01); *G02B 5/0816* (2013.01); *G02B 26/0841* (2013.01); *H01L 21/02019* (2013.01); *H01L 21/2003* (2013.01); *B81B 7/00* (2013.01); *G01B 2290/25* (2013.01); *G01J 2003/2879* (2013.01); *G02B 5/28* (2013.01)

(58) Field of Classification Search
CPC ......... G02B 5/08; G02B 5/28; H01L 21/2003; H01L 21/02019; G01B 9/02; G01B 9/02018; G01B 2290/25; B81B 7/00
USPC .......................................... 324/661; 356/519
See application file for complete search history.

(56) References Cited

U.S. PATENT DOCUMENTS

| | | | |
|---|---|---|---|
| 6,381,022 B1* | 4/2002 | Zavracky | G01J 3/10 356/454 |
| 6,399,405 B1 | 6/2002 | Chen et al. | |
| 2005/0032357 A1* | 2/2005 | Rantala | H01L 21/02126 438/637 |
| 2011/0019202 A1* | 1/2011 | Iwaki | G01J 3/26 356/519 |
| 2012/0188646 A1 | 7/2012 | Sano et al. | |
| 2014/0268345 A1 | 9/2014 | Sano | |
| 2014/0368825 A1 | 12/2014 | Rissanen et al. | |

FOREIGN PATENT DOCUMENTS

| | | |
|---|---|---|
| EP | 2816389 A1 | 12/2014 |
| JP | 2010-127739 A | 6/2010 |
| WO | 2013167811 A1 | 11/2013 |

OTHER PUBLICATIONS

European Search Report, Application No. 16761146.6, dated Aug. 1, 2018. 13 Pages.
First Office Action received for Chinese Patent Application No. 201680014528.1 dated May 10, 2018, 21 pages including 13 pages of English Translation.
Grigoras, K. et al. Porous Silicon Electrodes for High Performance Integrated Supercapacitors', 2014 Electronics System-Integration Technology Conference (ESTC), Sep. 16-18, 2014.
International Search Report, Application No. PCT/FI2016/050139, dated May 23, 2016, 3 pages.
Written Opinion of the International Searching Authority, Application No. PCT/FI2016/050139, 8 pages.

* cited by examiner

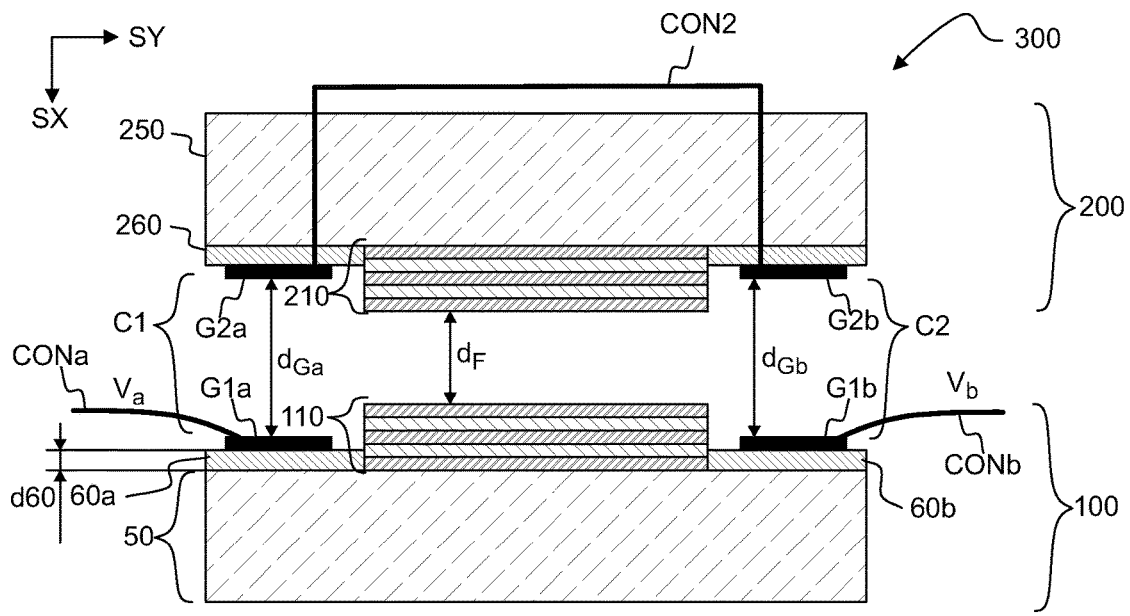
Comparative Example   Fig. 4a
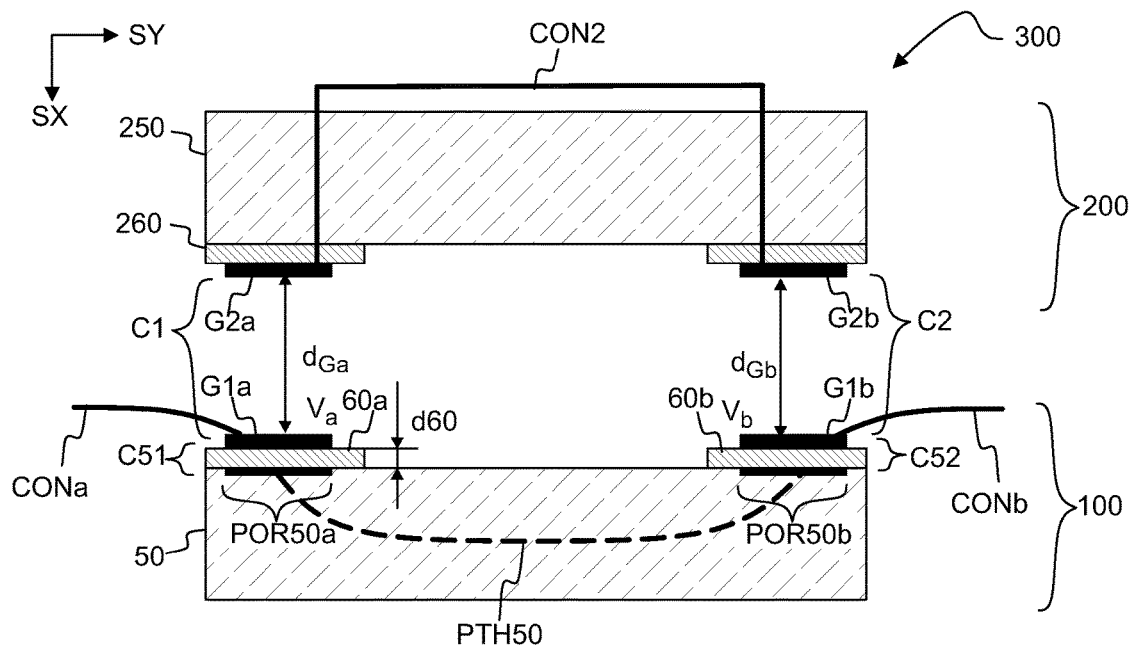
Comparative Example   Fig. 4b

Comparative Example

MIRROR PLATE FOR A FABRY-PEROT INTERFEROMETER AND A FABRY-PEROT INTERFEROMETER

FIELD

Some variations relate to a Fabry-Perot interferometer.

BACKGROUND

A Fabry-Perot interferometer comprises a first semi-transparent mirror and a second semi-transparent mirror, which are arranged to form an optical cavity. The Fabry-Perot interferometer may provide one or more transmission peaks. The spectral position of a transmission peak may be changed by changing the distance between the mirrors. The distance between the mirrors may be called as the mirror gap or as the mirror spacing. Performing a spectral measurement may comprise determining the spectral position of the transmission peak. The interferometer may comprise a capacitive sensor for monitoring the adjustable mirror gap. The spectral position of a transmission peak of the interferometer may be determined by e.g. monitoring the capacitance of the capacitive sensor.

SUMMARY

Some variations may relate to a Fabry-Perot interferometer. Some variations may relate to a mirror plate for a Fabry-Perot interferometer. Some variations may relate to an apparatus comprising a Fabry-Perot interferometer. Some variations may relate to a method of producing a mirror plate for a Fabry-Perot interferometer. Some variations may relate to a method for determining a spectral position of a Fabry-Perot interferometer. Some variations may relate to a method of producing a Fabry-Perot interferometer. Some variations may relate to measuring spectral data by a Fabry-Perot interferometer. Some variations may relate to calibrating a Fabry-Perot interferometer.

According to an aspect, there is provided a method for producing a mirror plate (100) for a Fabry-Perot interferometer (300), the method comprising:
  providing a substrate (50), which comprises silicon (Si),
  implementing a semi-transparent reflective coating (110) on the substrate (50),
  forming a passivated region (70a) in and/or on the substrate (50) by etching a plurality of voids (E1) in the substrate (50), and by passivating the surfaces of the voids (E1),
  forming a first sensor electrode (G1a) on top of the passivated region (70a), and
  forming a second sensor electrode (G1b) supported by the substrate (50).

Further aspects are defined in the claims.

The mirror plate of a Fabry-Perot interferometer may comprise one or more passivated regions, which may be arranged to reduce or prevent coupling from the first sensor electrode to the second sensor electrode via the silicon substrate. The passivated regions may improve measurement accuracy.

The Fabry-Perot interferometer comprises a first mirror plate and a second mirror plate. The spectral position of the transmission peak of the interferometer may be changed by changing the mirror gap. The interferometer may comprise sensor electrodes for monitoring the mirror gap. The sensor electrodes may form a sensor capacitor such that the capacitance of the sensor capacitor depends on the mirror gap. A change of the mirror gap may change the distance between the sensor electrodes. Changing the distance between the sensor electrodes may change the capacitance of the sensor capacitance. Consequently, the capacitance of the sensor capacitor may depend on the mirror gap such that the mirror gap may be monitored based on the capacitance of the sensor capacitor.

The reflective coating and the sensor electrodes of a mirror plate may be implemented on a silicon substrate e.g. in order to provide a highly stable region at low manufacturing costs. The interferometer may be a microelectromechanical system (MEMS). The silicon may be substantially transparent at wavelengths longer than 1.1 µm. Consequently, the interferometer may be suitable for use in the infrared region. When compared with borosilicate glass, the absorbance of silicon may be substantially lower than the absorbance of low expansion borosilicate glass ("BK7") at wavelengths longer than 2 µm. However, the proximity of the silicon substrate may disturb operation of capacitive sensor electrodes. The electrical conductivity of the silicon may depend on the operating temperature, and the sensor electrodes may be coupled to the substrate. The sensor electrodes may be coupled to each other via the substrate. The coupling to the substrate may cause temperature-dependent error in monitoring the mirror gap. The varying electrical conductivity of the substrate may disturb the capacitive monitoring of the mirror gap. The interferometer may comprise one or more passivated regions, which may be arranged to suppress or eliminate the disturbing effect.

The passivated region may comprise a passivated three-dimensional structure. The passivated region may comprise a passivated three-dimensional microstructure. The passivated structure may provide a thick electrically insulating layer, which may reduce coupling between a sensor electrode and the substrate. The thickness of the passivated region may be e.g. greater than 10 µm. The passivated microstructure may decouple the sensor electrode from the substrate. The passivated regions may reduce the magnitude of leakage current from the sensor electrode to the substrate.

The passivated three-dimensional microstructure may be formed by etching a plurality of microscopic voids in the silicon substrate, and by passivating the surfaces of the voids. The passivation may substantially reduce the electrical conductivity of the surfaces of the voids. The passivation may be performed by covering the surfaces of the voids with electrically insulating material and/or by converting the material of the walls of the voids into electrically insulating material.

The surfaces of the voids may be converted into electrically insulating material e.g. by oxidation. The walls of the voids may comprise silicon, which may be converted into silica $SiO_2$ by oxidation. Conversion of silicon into $SiO_2$ may also locally increase the volume of the material so that the voids may be partly filled with $SiO_2$.

In an embodiment, one or more passivated regions may comprise passivated porous silicon. Selected regions of the silicon substrate may be converted into porous silicon by etching, e.g. by using electrochemical etching. The etched regions may be subsequently passivated in order to form passivated porous silicon (PPS). The porous silicon may be passivated e.g. by oxidation.

The voids may be partly or completely filled by depositing insulating material on the walls of the voids. The voids may be passivated e.g. by atomic layer deposition (ALD), or by chemical vapor deposition (CVD).

The voids may be formed e.g. by etching a plurality of microscopic grooves, holes, channels and/or pores in the silicon substrate. For example, deep and narrow grooves or holes may be formed by electrochemical etching, by reactive ion etching (RIE) or by deep reactive ion etching (DRIE). When the voids are pores, a plurality of interconnected open pores may be formed e.g. by electrochemical etching. The interconnected pores may form channels, which extend deep into the substrate. The passivated region may be produced in a relatively short time. The thickness of the passivated region may be effectively determined by etching. Even relatively deep grooves or channels may be formed by the etching step so that the thickness of the passivated region is not limited by oxidation kinetics.

Forming the passivated regions may allow controlling mechanical stress inside the substrate e.g. by controlling the size of the voids, by controlling oxidation parameters and/or by controlling deposition parameters. The passivated regions may be formed such that the mechanical stress remains lower than a predetermined limit at the nominal operating temperature. Consequently, the reflective coatings may stay flat during the normal operation of the interferometer.

In particular, forming passivated porous silicon may allow controlling mechanical stress inside the substrate by controlling the pore size and oxidation parameters. The passivated porous silicon may be formed such that the mechanical stress remains lower than a predetermined limit at the nominal operating temperature.

One or more passivated regions may be implemented such that the thermally induced change of reactance between the first sensor electrode and the second sensor electrode is smaller than e.g. 0.1% of a reference value when the temperature of the substrate is changed by 1° C.

BRIEF DESCRIPTION OF THE DRAWINGS

In the following examples, the embodiments will be described in more detail with reference to the appended drawings, in which.

DETAILED DESCRIPTION

Figure 1:
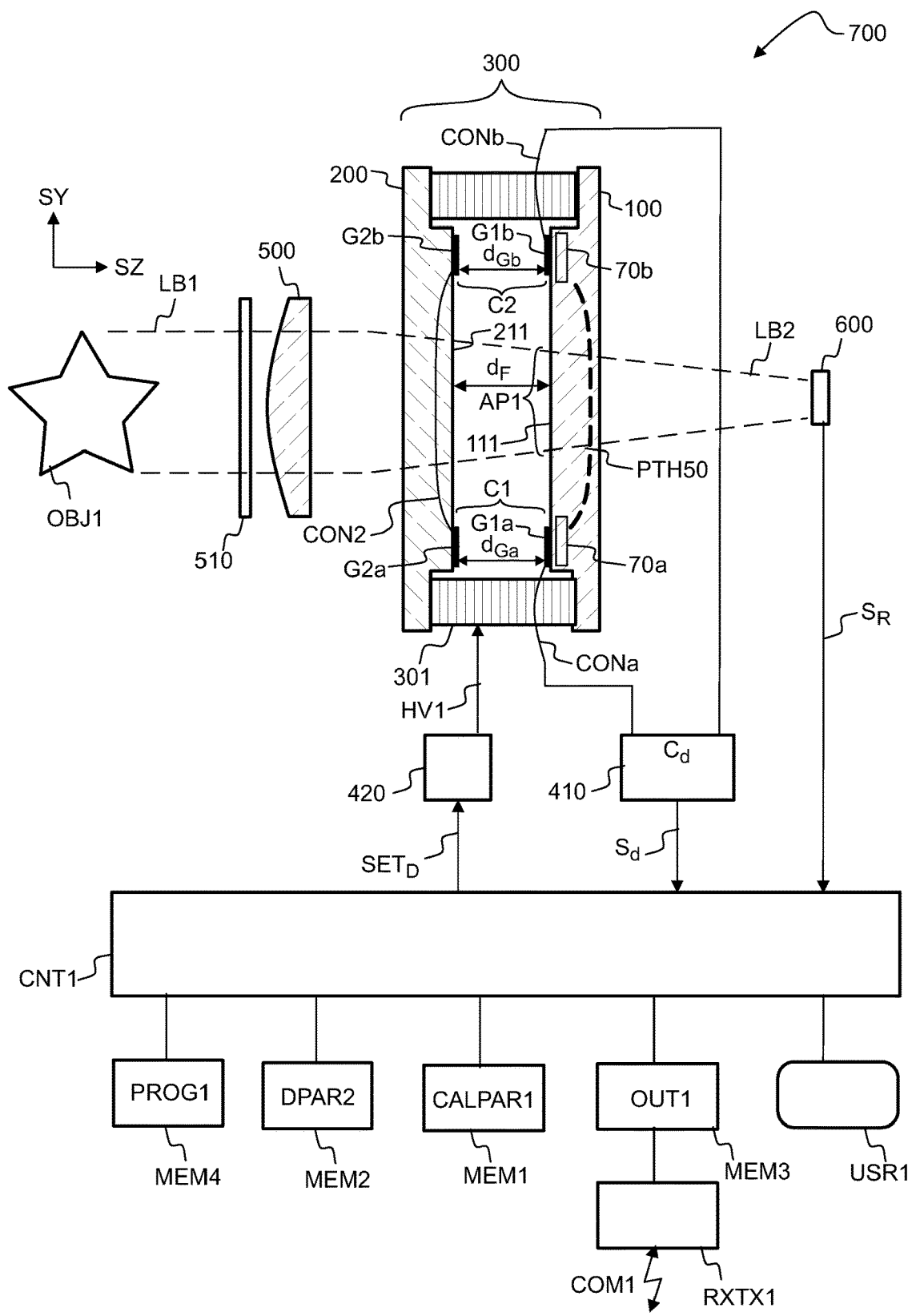
FIG. 1 shows, by way of example, in a cross-sectional side view, a spectrometer, which comprises a Fabry-Perot interferometer.

Referring to FIG. 1, a spectrometer 700 may comprise a Fabry-Perot interferometer 300. An object OBJ1 may reflect, emit and/or transmit light LB1, which may be transmitted through the interferometer 300 in order to monitor the spectrum of the light LB1. The interferometer 300 may be used e.g. for measuring reflection, transmission (absorption) and/or emission of the light LB1 of the object OBJ1.

The Fabry-Perot interferometer 300 comprises a first mirror plate 100 and a second mirror plate 200. The first mirror plate 100 may comprise a semi-transparent reflective coating, which has an outer layer 111. The first mirror plate 100 may have an aperture portion AP1 for transmitting and/or reflecting light LB1. The aperture portion AP1 may be an exposed portion of the semi-transparent reflective coating, which is capable of transmitting and/or reflecting light LB1. Light LB1 impinging on the aperture portion AP1 may be transmitted through the aperture portion AP1 and/or light LB1 impinging on the aperture portion AP1 may be reflected by the aperture portion AP1. The mirror gap $d_F$ may be adjusted to provide constructive interference for transmitted light at a given wavelength so that the aperture portion AP1 may transmit light. The mirror gap $d_F$ may also be adjusted to provide destructive interference for transmitted light at the given wavelength so that the aperture portion AP1 may reflect light.

The width of the aperture portion AP1 may be e.g. in the range of 0.5 mm to 2.0 mm, in the range of 2 mm to 20 mm, in the range of 20 mm to 50 mm, or in the range of 50 mm to 100 mm. The width of the aperture portion AP1 may be e.g. in the range of 0.5 mm to 50 mm. The width of the aperture portion AP1 may be e.g. in the range of 2.0 mm to 50 mm. The aperture portion AP1 may have e.g. a substantially circular form or a substantially rectangular form.

The second mirror plate 200 may comprise a semi-transparent reflective coating, which has an outer layer 211. The outer layer 211 of the second plate 200 may be opposite the outer layer 111 of the first plate 100.

The interferometer 300 may comprise sensor electrodes G1a, G2a, G1b, G2b for capacitively monitoring the mirror gap $d_F$. Sensor electrodes G1a, G1b may be attached to the substrate 50 of the first mirror plate 100. Sensor electrodes G2a, G2b may be attached to the second mirror plate 200. The electrodes G1a, G2a may form a first sensor capacitor C1. The electrodes G1b, G2b may form a second sensor capacitor C2. The distance $d_{Ga}$ between the electrodes G1a, G2a may depend on the mirror gap $d_F$, and the capacitance $C_1$ of the first sensor capacitor C1 may depend on the distance $d_{Ga}$ such that the mirror gap $d_F$ may be monitored by monitoring the capacitance $C_1$ of the first sensor capacitor C1. The distance dGb between the electrodes G1b, G2b may depend on the mirror gap $d_F$, and the capacitance $C_2$ of the second sensor capacitor C2 may depend on the distance dGb such that the mirror gap $d_F$ may be monitored also by monitoring the capacitance $C_2$ of the second sensor capacitor C2.

The mirror gap $d_F$ may depend on the distance $d_{Ga}$ and/or on the distance $d_{Gb}$. The mirror gap $d_F$ may be monitored by monitoring the capacitance $C_1$ and/or $C_2$. The distance $d_{Ga}$ between the sensor electrodes G1a, G2a may also be called as the electrode gap.

The sensor capacitors C1, C2 may be connected to a capacitance monitoring unit 410 by conductors CONa, CONb. The mirror plate 200 may move with respect to the mirror plate 100. The sensor capacitors C1, C2 may be connected in series e.g. in order to avoid using a moving electrical conductor between the mirror plate 200 and the capacitance monitoring unit 410. The sensor capacitors C1, C2 may be connected in series e.g. by a conductor CON2. The electrode G2a may be galvanically connected to the electrode G2b by the conductor CON2.

The substrate 50 may provide a semi-conductive path PTH50, which may disturb capacitive monitoring of the mirror gap $d_F$. The semi-conductive path PTH50 may cause temperature-dependent coupling between the sensor electrodes G1a, G1b. The semi-conductive path PTH50 may also cause temperature-dependent leakage current from the sensor electrode G1a, G1b. The mirror plate 100 may comprise one or more passivated regions 70a, 70b, which may be arranged to reduce or eliminate the disturbing effect of the semi-conductive path PTH50.

The Fabry-Perot interferometer 300 may comprise a first mirror plate 100 and a second mirror plate 200. The first mirror plate 100 may comprise:
  a substrate 50, which comprises silicon,
  a semi-transparent reflective coating 110 implemented on the substrate 50,
  a passivated region 70a formed in and/or on the substrate 50, and
  a first sensor electrode G1a formed on top of the passivated region 70a, and
  a second sensor electrode G1b.

The second mirror plate 200 may comprise a third sensor electrode G2a and a fourth sensor electrode G2b such that the first sensor electrode G1a and the third sensor electrode G2a form a first sensor capacitor C1, the second sensor electrode G1b and the fourth sensor electrode G2b form a second sensor capacitor C2, the first sensor capacitor C1 and the second sensor capacitor C2 may be connected in series, the capacitance $C_1$ of the first sensor capacitor C1 may be indicative of the mirror gap $d_F$ of the Fabry-Perot interferometer 300.

The electrodes G1a, G1b and the substrate may together form a combination, which has parasitic impedance. The reactive part of said parasitic impedance may be represented by a parasitic capacitance $C_{PAR}$. The electrode G1a and the substrate may form a first parasitic capacitor. The electrode G1b and substrate the may form a second parasitic capacitor. The first and the second parasitic capacitors may be connected in series by the semi-conducting path PTH50 such that the parasitic capacitance $C_{PAR}$ of the combination may be equal to e.g. 50% of the capacitance of the first parasitic capacitor.

The thickness d70 of the passivated regions 70a, 70b of the mirror plate 100 may be implemented such that a thermally induced change of capacitance $C_{PAR}$ between the first sensor electrode G1a and the second sensor electrode G1b is e.g. smaller than 0.1% of the capacitance $C_1$ of the first sensor capacitor C1. In an embodiment, the thermally induced change of capacitance $C_{PAR}$ may be even smaller than 0.02%.

The parasitic impedance may have a reactance $X_{PAR}$ (i.e. a reactive part). The capacitance $C_{PAR}$ and/or the reactance $X_{PAR}$ may be measured e.g. by applying a sinusoidal test voltage $V_{TEST}$ between the first sensor electrode G1a and the second sensor electrode G1b. The RMS voltage of the sinusoidal test voltage $V_{TEST}$ may be e.g. 1 V, and the frequency of the sinusoidal test voltage $V_{TEST}$ may be e.g. 10 kHz. RMS means root mean square.

The reactance $X_{PAR}$ may depend on the parasitic capacitance $C_{PAR}$ according to the following equation:

$$X_{PAR} = \frac{1}{2\pi f \cdot C_{PAR}} \tag{1a}$$

The test frequency f may be e.g. equal to 10 kHz.

The thermally induced change $\Delta X_{PAR}$ of the reactance $X_{PAR}$ may be compared with a reference reactance $X_{REF}$. The reference reactance $X_{REF}$ may be e.g. equal to the reactance $X_1$ of the first sensor capacitor C1 in a situation where the test frequency f is equal to a reference frequency, and where the electrodes G1a, G2a are separated by a reference distance.

The capacitance $C_1$ of the first sensor capacitor C1 may be approximated by the following equation:

$$C_1 \approx \frac{\varepsilon \cdot A}{d_{Ga}} \tag{1b}$$

where $\varepsilon$ denotes the dielectric permittivity of vacuum, A denotes the area of the first sensor electrode G1a, and $d_{Ga}$ denotes the distance between the electrodes G1a, G2a.

The reactance $X_1$ of the first sensor capacitor C1 may be calculated according to the following equation:

$$X_1 = \frac{1}{2\pi f \cdot C_1} \tag{1c}$$

$$X_1 = \frac{1}{2\pi f \cdot \left(\frac{\varepsilon \cdot A}{d_{Ga}}\right)} \tag{1d}$$

A reference reactance $X_{REF}$ may be calculated from equation (1d) e.g. by assuming that a reference distance ($d_{Ga}$) between the electrodes G1$a$, G2$a$ is equal to 50 μm, and that the reference frequency (f) is equal to 10 kHz:

$$X_{REF} = \frac{1}{2\pi \cdot 10 \text{ kHz} \cdot \left(\frac{\varepsilon \cdot A}{50 \text{ μm}}\right)} \quad (1e)$$

The passivated region 70$a$ may be implemented such that the thermally induced change $\Delta X_{PAR}$ of the reactance $X_{PAR}$ is smaller than 0.1% of the reference reactance $X_{REF}$, when distance $d_{Ga}$ is kept constant and the temperature is changed by 1° C.

The passivated region 70$a$ may be implemented such that a thermally induced change $\Delta X_{PAR}$ of reactance $X_{PAR}$ between the first sensor electrode G1$a$ and the second sensor electrode G1$b$ is smaller than 0.1% of a reference value $X_{REF}$ when the temperature of the substrate 50 is changed by 1° C., wherein the reactance $X_{PAR}$ is determined at the frequency of 10 kHz, and the reference value $X_{REF}$ is calculated according to the following equation:

$$X_{REF} = \frac{1}{2\pi \cdot 10 \text{ kHz} \cdot \left(\frac{\varepsilon \cdot A}{50 \text{ μm}}\right)} \quad (1f)$$

where ε denotes the dielectric permittivity of vacuum, and A denotes the area of the first sensor electrode G1$a$.

The passivated region 70$a$ and/or 70$b$ of mirror plate 100 of the interferometer 300 may be implemented such that thermally induced relative change $\Delta X_{PAR}/X_{PAR}$ of reactance $X_{PAR}$ between the first sensor electrode G1$a$ and the second sensor electrode G1$b$ is smaller than 0.1% when distance $d_{Ga}$ is kept constant and the temperature is changed by 1° C.

The sensor electrodes of the first mirror plate 100 may be connected to a capacitance monitoring unit 410 in order to monitor the capacitances of the capacitors C1, C2. The capacitance value of the capacitor C1 and/or C2 may be indicative of the mirror gap $d_F$. The capacitance monitoring unit 410 may provide a sensor signal $S_d$ indicative of the capacitance of a capacitor circuit, which comprises the capacitors C1 and C2. The capacitance monitoring unit 410 may provide a sensor signal $S_d$ indicative of the mirror gap $d_F$. The capacitance monitoring unit 410 may provide a sensor signal $S_d$ indicative of the spectral position of a transmission peak PEAK1 (see FIG. 2). The sensor signal $S_d$ may also be called as a feedback signal.

When connected in series, the first sensor capacitor C1 and the second sensor capacitor C2 may together form a sensor capacitor system, which has a capacitance $C_d$. The capacitance monitoring unit 410 may be arranged to monitor the capacitance $C_d$ e.g. by charging the sensor capacitor system with a predetermined current, and by measuring the time needed to charge the sensor capacitor system to a predetermined voltage. The capacitance monitoring unit 410 may be arranged to monitor the capacitance $C_d$ e.g. by coupling the sensor capacitor system as a part of a resonance circuit, and by measuring the resonance frequency of the resonance circuit. The capacitance monitoring unit 410 may be arranged to monitor the capacitance $C_d$ e.g. by using the sensor capacitor system to repetitively transfer charge to an auxiliary tank capacitor, and counting the number of charge transfer cycles needed to reach a predetermined tank capacitor voltage. The capacitance monitoring unit 410 may be arranged to monitor the capacitance $C_d$ e.g. by comparing the capacitance of the sensor capacitor system with a reference capacitor.

The mirror gap $d_F$ may be adjusted by one or more actuators 301. One or more actuators 301 may be arranged to move the second mirror plate 200 with respect to the first mirror plate 100. The actuator 301 may be e.g. a piezoelectric actuator, an electrostatic actuator, an electrostrictive actuator, or a flexoelectric actuator. The reflective coatings of the mirror plates 100, 200 may be substantially flat and substantially parallel to each other. The flatness of the aperture portion AP1 of the mirror plate 100 may be e.g. better than $\lambda_N/20$, better than $\lambda_N/50$, better than $\lambda_N/100$ or even better than $\lambda_N/200$, in order to provide a suitable finesse (i.e. the ratio of the free spectral range to the spectral width of a transmission peak). $\lambda_N$ denotes a predetermined operating wavelength. When operating in the infrared region, the predetermined operating wavelength $\lambda_N$ may be e.g. 2000 nm or 4000 nm. In particular, the predetermined operating wavelength $\lambda_N$ may be equal to $(\lambda_{min}+\lambda_{max})/2$, where $\lambda_{min}$ and $\lambda_{max}$ denote the cut-off wavelengths $\lambda_{min}$ and $\lambda_{max}$ of the interferometer (See FIG. 2). When the flatness is better than $\lambda_N/100$, this means that the RMS deviation of the local height of the surface of the mirror from a hypothetical flat reference surface is smaller than $\lambda_N/100$. RMS means root mean square.

The spectrometer 700 may comprise a control unit CNT1. The control unit CNT1 may be arranged to send a control signal $SET_D$ to the interferometer 300 in order to adjust the mirror gap $d_F$. The interferometer 300 may comprise a driver unit 420. The driver unit 420 may e.g. convert a digital control signal $SET_D$ into an analog signal suitable for driving one or more actuators 301. The driver unit 420 may provide a signal HV1 for driving an actuator 301. The driver unit 420 may provide a high voltage signal HV1 for driving a piezoelectric actuator 301.

The capacitance monitoring unit 410 may provide a sensor signal $S_d$. The sensor signal may be used for monitoring the mirror gap $d_F$. The spectral response of the spectrometer 700 may be calibrated e.g. as a function of the mirror gap $d_F$. The spectrometer 700 may comprise a memory MEM2 for storing spectral calibration parameters DPAR2. The mirror gap $d_F$ and/or a spectral position λ may be determined from the sensor signal $S_d$ e.g. by using the spectral calibration parameters DPAR2.

The Fabry-Perot interferometer 300 may form transmitted light LB2 by filtering the light LB1 obtained from the object OBJ1. The spectrometer 700 may comprise an optical detector 600. The interferometer 300 may be optically coupled to the detector 600. The transmitted light LB2 may impinge on the detector 600.

The optical detector 600 may be an image sensor or a non-imaging detector. For non-imaging spectral analysis, the sensor 600 may be a non-imaging detector. A non-imaging detector may provide an intensity signal, which is indicative of the intensity of the transmitted light LB2. The optical detector 600 may be arranged to provide a signal $S_R$, which is indicative of the intensity of the transmitted light LB2.

The spectrometer 700 may optionally comprise imaging optics 500. The imaging optics 500 may be arranged to focus light LB2 to the image sensor 600. The transmitted light LB2 may form an optical image, which may be captured by the image sensor 600. The imaging optics 500 may be arranged to form one or more two-dimensional optical images of the object OBJ1 on the image sensor 600.

The image sensor 600 may be arranged to convert an optical image of the object OBJ1 into a digital image. The image sensor 600 may be arranged to capture a digital image of the object OBJ1. The image sensor 600 may comprise a plurality of detector pixels. Each detector pixel may be arranged to provide a signal $S_R$, which is indicative of intensity impinging on said pixel. The image sensor 600 may be e.g. a CMOS image sensor (Complementary Metal Oxide Semiconductor) or a CCD image sensor (Charge Coupled Device).

The imaging optics 500 may comprise e.g. one or more refractive lenses and/or one or more reflective surfaces (e.g. a paraboloid reflector). The imaging optics 500 may be positioned e.g. between the interferometer 300 and the image sensor 600 and/or between the object OBJ1 and the interferometer 300. One or more components of the imaging optics 500 may also be positioned before the interferometer 300 and one or more components of the imaging optics 500 may be positioned after the interferometer 300. The optics 500 may be omitted e.g. when the spectrometer 700 is used for non-imaging spectral analysis. However, the imaging optics 500 may also be used to focus transmitted light LB2 to a non-imaging detector 600.

The spectrometer 700 may be arranged to measure spectral intensities e.g. in the infrared region. The image sensor 600 may be sensitive e.g. in the infrared region.

The spectrometer 700 may optionally comprise a memory MEM1 for storing intensity calibration parameters CALPAR1. The spectrometer 700 may be arranged to obtain detector signal values $S_R$ from the detector 600, and to determine intensity values $X(\lambda)$ from the detector signal values $S_R$ by using one or more intensity calibration parameters CALPAR1. At each mirror gap $d_F$, an intensity value $X(\lambda)$ of the light LB1 may be determined from a detector signal $S_R$ by using the one or more intensity calibration parameters CALPAR1. For example, a signal $S_R(\lambda)$ may be substantially proportional to the intensity impinging on the detector 600 or on a single detector pixel of the detector 600 when the interferometer has been adjusted to the spectral position $\lambda_0$. The intensity calibration parameters CALPAR1 may comprise one or more parameters, which define an intensity calibration function $Q_{Rn}(\lambda)$. The intensity $X(\lambda)$ may be determined from the signal $S_R(\lambda)$ e.g. by the equation:

$$X(\lambda) = Q_{Rn}(\lambda) \cdot S_R(\lambda) \quad (2)$$

The spectrometer 700 may optionally comprise a memory MEM3 for storing output OUT1. The output OUT1 may comprise e.g. detector signals $S_R$ and/or intensity values determined from the detector signals. The output OUT1 may comprise one or more digital images of the object OBJ1.

The spectrometer 700 may comprise a memory MEM4 for storing a computer program PROG1. The computer program PROG1 may be configured, when executed by one or more data processors (e.g. CNT1), cause the apparatus 300, 700 to determine one or more spectral positions $\lambda$ by monitoring the capacitance of the sensor capacitors C1, C2. One or more spectral positions $\lambda$ may be determined by monitoring the capacitance of the sensor capacitors C1, C2, and by using the spectral calibration data DPAR2.

The computer program PROG1 may be configured, when executed by one or more data processors (e.g. CNT1), to obtain one or more detector signal values $S_R$ from the optical sensor 600, and to determine one or more intensity values $X(\lambda)$ from the detector signal values $S_R$ by using intensity calibration parameters CALPAR1. The spectrometer 700 may be arranged to provide one or more intensity values $X(\lambda)$. In an embodiment, the spectrometer 700 may be arranged to compare a measured intensity value $X(\lambda)$ with a reference value. In an embodiment, the spectrometer 700 may be arranged to compare a ratio of measured intensity values with a reference value.

The spectrometer 700 may optionally comprise a user interface USR1 e.g. for displaying information to a user and/or for receiving commands from the user. The user interface USR1 may comprise e.g. a display, a keypad and/or a touch screen.

The spectrometer 700 may optionally comprise a communication unit RXTX1. The communication unit RXTX1 may transmit and/or receive a signal COM1 e.g. in order to receive commands, to receive calibration data, and/or to send output data OUT1. The communication unit RXTX1 may have e.g. wired and/or wireless communication capabilities. The communication unit RXTX1 may be arranged to communicate e.g. with a local wireless network (WLAN), with the Internet and/or with a mobile telephone network.

The spectrometer 700 may be implemented as a single physical unit or as a combination of separate units.

The spectrometer 700 may optionally comprise one or more optical cut-off filters 510 to limit the spectral response of the detector 600. The one or more filters 510 may define the spectral range of the spectrometer 700. The one or more filters 510 may be positioned before and/or after the interferometer 300.

Figure 2:
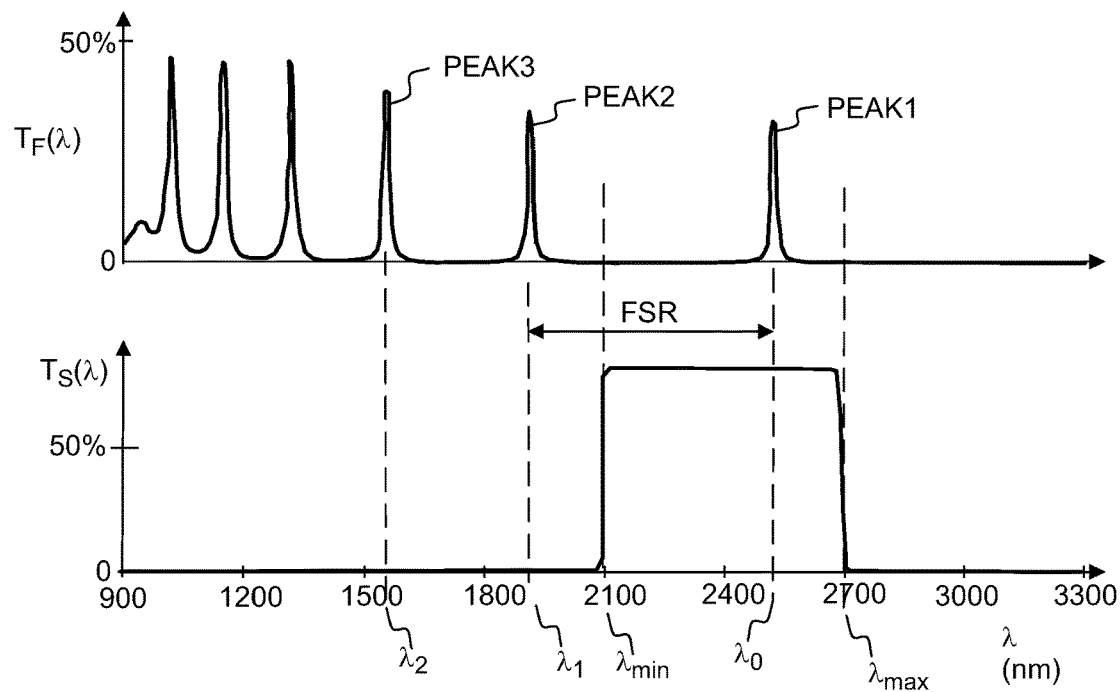
FIG. 2 shows, by way of example, spectral transmittance peaks of a Fabry-Perot interferometer.

The spectrometer 700 may optionally comprise e.g. a lens and/or an aperture, which is arranged to limit the divergence of the light LB2 transmitted through the interferometer 300, in order to provide a narrow bandwidth for the transmission peak PEAK1 (FIG. 2). For example, the divergence of the light LB2 may be limited to be smaller than or equal to 10 degrees. When using focusing optics 500, the optics 500 may also be positioned between the interferometer 300 and the sensor 600 in order to minimize divergence of light in the optical cavity formed by the mirror plates 100, 200.

The reverse side of the mirror plate 100 and/or 200 may be optionally coated with an anti-reflection coating.

For some applications, it is not necessary to determine calibrated intensity values. For example, the spectral position (wavelength) of a laser beam may also be measured by the spectrometer 700 by using the spectral calibration data DPAR2, without using the intensity calibration data CALPAR1.

SX, SY and SZ denote orthogonal directions. The light LB2 may propagate substantially in the direction SZ.

FIG. 2 shows, by way of example, the spectral transmittance of a Fabry-Perot interferometer 300, and the pass band of an optional filter 510. The uppermost curve of FIG. 2 shows the spectral transmittance $T_F(\lambda)$ of the Fabry-Perot interferometer 300. The spectral transmittance $T_F(\lambda)$ may have one or more adjacent transmittance peaks PEAK1, PEAK2, PEAK3 of the Fabry-Perot interferometer 300. For example, a first transmittance peak PEAK1 may be at a wavelength $\lambda_0$, a second transmittance peak PEAK2 may be at a wavelength $\lambda_1$, and a third transmittance peak PEAK1 may be at a wavelength $\lambda_2$. The spectral positions $\lambda_0$, $\lambda_1$, $\lambda_2$ of the transmission peaks PEAK1, PEAK2, PEAK3 may depend on the mirror gap $d_F$ according to the Fabry-Perot transmission function. The spectral position of the first peak PEAK1 may be a function $\lambda_0(d_F)$ of the mirror gap $d_F$. The spectral position of the second peak PEAK2 may be a function $\lambda_1(d_F)$ of the mirror gap $d_F$. The spectral position of the third peak PEAK3 may be a function $\lambda_2(d_F)$ of the mirror gap $d_F$. The spectral positions of the transmission peaks may be changed by changing the mirror gap $d_F$. The spectral positions of the transmission peaks may be changed by tuning the mirror gap $d_F$.

The transmission peaks PEAK1, PEAK2, PEAK3 may also be called passbands of the Fabry-Perot interferometer. The spectral positions $\lambda_0$, $\lambda_1$, $\lambda_2$ may be shifted by changing the mirror gap $d_F$. The free spectral range FSR between adjacent peaks may depend on the mirror gap $d_F$. The Fabry Perot interferometer may comprise capacitive electrodes G1a, G2a, G1b, G2b for monitoring the spectral position of at least one transmission peak PEAK1.

The spectral position of at least one transmission peak PEAK1 may be monitored by monitoring the capacitance of a sensor capacitor, which comprises the electrodes G1a, G2a. The spectral position of at least one transmission peak PEAK1 may be determined by monitoring the capacitance of a sensor capacitor, which comprises the electrodes G1a, G2a.

Each transmission peak PEAK1, PEAK2, PEAK3 of the Fabry Perot interferometer may be associated with a specific order of interference. For example, the first transmittance peak PEAK1 may be associated with an order of interference m, the second transmittance peak PEAK2 may be associated with the order of interference m+1, and the third transmittance peak PEAK3 may be associated with the order of interference m+2. The order of interference m may be e.g. a positive integer.

The spectrometer 700 may optionally comprise one or more optical cut-off filters 510 to limit the spectral response of the spectrometer 700. The one or more filters 510 may together provide a spectral transmittance $T_S(\lambda)$. The one or more filters 510 may provide a pass band defined by cut-off wavelengths $\lambda_{min}$ and $\lambda_{max}$.

When the spectral range defined by the wavelengths $\lambda_{min}$ and $\lambda_{max}$ contains only one peak PEAK1, a single intensity value $X(\lambda)$ may be determined from a single detector signal $S_R$ obtained from the detector 600.

In an embodiment, a detector unit 600 may comprise several detectors (e.g. detector pixels), which have two (or more) different spectral sensitivity curves. In that case the spectral range defined by the wavelengths $\lambda_{min}$ and $\lambda_{max}$ may contain two or more peaks PEAK1, PEAK2, and several intensity values (e.g. $X(\lambda_0)$ and $X(\lambda_1)$) may be simultaneously measured by using detector signals obtained from the detectors.

Figure 3:
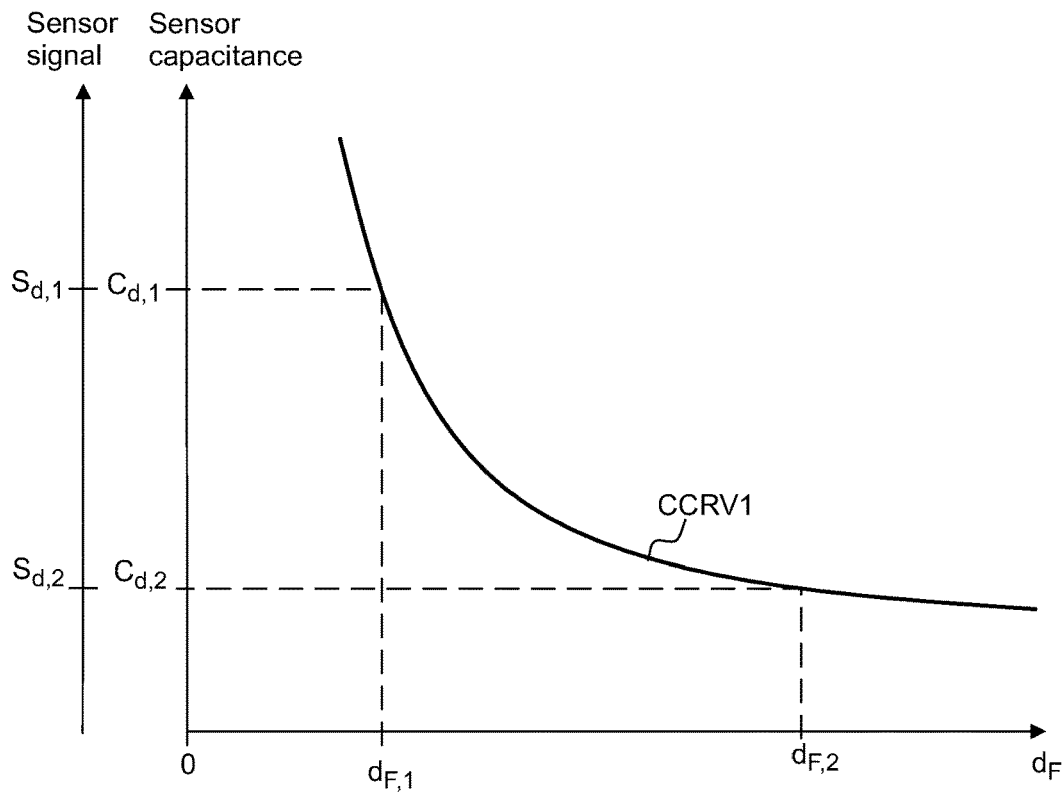
FIG. 3 shows, by way of example, the relationship between the mirror, gap and the capacitance of a sensor capacitor.

FIG. 3 shows, by way of example, a relation between the mirror gap $d_F$ and the capacitance value $C_d$ of a sensor capacitor system. The curve CCRV1 of FIG. 3 shows the sensor capacitance $C_d$ as the function of the mirror gap $d_F$. To the first approximation, the value of the sensor capacitance $C_d$ may be inversely proportional to the value of the electrode gap $d_{Ga}$. $C_{d,1}$ denotes the sensor capacitance at the mirror gap value $d_{F,1}$. $C_{d,2}$ denotes the sensor capacitance at the mirror gap value $d_{F,2}$.

The control unit CNT1 may be arranged to determine the value of the mirror gap $d_F$ from the measured value of the sensor capacitance $C_d$. The capacitance monitoring unit 410 may provide a sensor signal value $S_{d,1}$ when the sensor capacitance has a value $C_{d,1}$. The capacitance monitoring unit 410 may a provide a sensor signal value $S_{d,2}$ when the sensor capacitance has a value $C_{d,2}$.

Referring to the comparative example shown in FIGS. 4a and 4b, a Fabry-Perot interferometer 300 may comprise a first mirror plate 100 and a second mirror plate 200. The first mirror plate 100 may comprise sensor electrodes G1a, G1b. The second mirror plate 200 may comprise sensor electrodes G2a, G2b. The electrodes G1a and G2a may together form a first sensor capacitor C1, which has a capacitance $C_1$. The electrodes G1b and G2b may together form a second sensor capacitor C2, which has a capacitance $C_2$.

The electrodes G1a, G1b may be supported by the substrate 50 of the first mirror plate 100. The electrode G1a may be formed on an insulating layer 60a, which has been implemented on the substrate 50. The electrode G1b may be formed on an insulating layer 60b, which has been implemented on the substrate 50. $d_{60}$ may denote a distance between the electrode G1a and the substrate 50. The electrode G1a may be implemented on the insulating layer 60a e.g. by depositing conductive material on the insulating layer 60a.

The electrodes G2a, G2b of the second mirror plate 200 may be galvanically connected to each other by a conductor CON2.

The insulating layer 60a may be supported by a supporting portion POR50a of the substrate 50. The insulating layer 60b may be supported by a supporting portion POR50b of the substrate 50. The substrate 50 may provide a semiconductive path PTH50, which electrically connects the supporting portion POR50a to the supporting portion POR50b. The substrate 50 may provide a semiconductive path PTH50 between the supporting portions POR50a, POR50b.

The insulating layers 60a, 60b may consist of solid silica ($SiO_2$). The insulating silica layer may be formed e.g. by deposition and/or oxidation. In practice, the insulating silica layer should be formed in a limited time period, e.g. in a few hours. Due to the limited processing time, the thickness of the insulating silica layer is typically smaller than or equal to 2 μm. Increasing the thickness of the silica layer may be difficult or impossible, because it may require excessively long processing times. Due to the thin layers 60a, 60b, the sensor electrode G1a may be capacitively coupled to the sensor electrode G1b via the path PTH50. The impedance of the path PTH50 may depend on the concentration of impurities in the substrate 50. The impedance of the path PTH50 may strongly depend on the temperature. The impedance of the path PTH50 may vary from one substrate 50 to another.

The electrode G1a and the supporting portion POR50a may together form a first parasitic capacitor C51. The electrode G1b and the supporting portion POR50b may together form a second parasitic capacitor C52. The first parasitic capacitor C51 may be connected to the second parasitic capacitor C52 via the path PTH50.

The monitoring unit 410 may be connected to the electrodes G1a, G1b in order to monitor the mirror gap $d_F$. The monitoring unit 410 may be coupled to the electrodes G1a, G1b in order to monitor the capacitance of the capacitor system, which comprises the capacitors C1, C2 connected in series. However, the parasitic capacitors C51, C52 may disturb accurate monitoring of the mirror gap $d_F$. The contribution of the parasitic capacitors C51, C52 to the total capacitance $C_{tot}$ may depend on the operating temperature of the substrate 50. The contribution of the parasitic capacitors C5, C52 may vary from one substrate 50 to another.

Figure 4C:
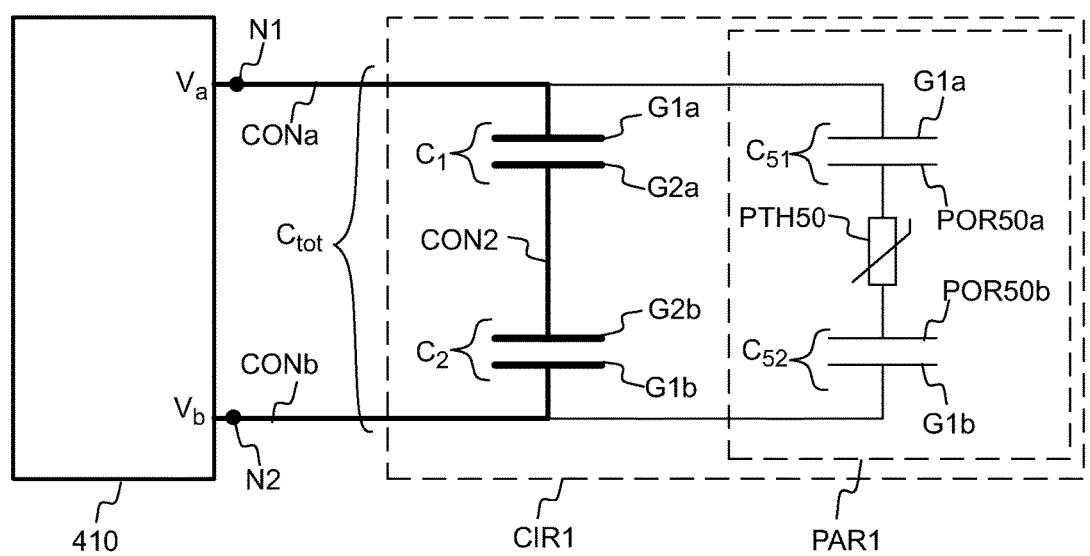
FIG. 4a shows, by way of example, in a cross-sectional side view, a Fabry-Perot interferometer, which comprises parasitic capacitors.
FIG. 4b shows, by way of example, in a cross-sectional side view, the parasitic capacitors of the Fabry-Perot interferometer of FIG. 4a, FIG. 4c shows a capacitor circuit, which represents the interferometer of FIG. 4a, FIG. 5a shows, by way of example, in a cross-sectional side view, a Fabry-Perot interferometer, which comprises passivated regions.

FIG. 4c shows a capacitor circuit CIR1 connected to a capacitance monitoring unit 410. The circuit CIR1 represents the interferometer 300 shown in FIGS. 4a and 4b. The monitoring unit 410 may have input nodes N1, N2. The electrode G1a of the first sensor capacitor C1 may be connected to the input node N1 by the conductor CONa. The electrode G1b of the second sensor capacitor C2 may be connected to the input node N2 by the conductor CONb. The electrode G2a may be connected to the electrode G2b.

A parasitic capacitor circuit PAR1 may comprise the first parasitic capacitor C51 and the second parasitic capacitor C52 such that the parasitic capacitors C51, C52 are connected in series by the semi-conducting path PTH50. The impedance of the semi-conducting path PTH50 may vary. For example, impedance of the semi-conducting path PTH50 may depend on the temperature of the substrate. For example, impedance of the semi-conducting path PTH50 may depend on the current flowing through the path PTH50. The conductivity of the semi-conducting path PTH50 may depend on the temperature.

The parasitic capacitor circuit PAR1 may have a parasitic capacitance $C_{PAR}$.

The total capacitance $C_{tot}$ of the capacitor circuit CIR1 may be approximately equal to the sum of the sensor capacitance value $C_d$ and the parasitic capacitance value $C_{PAR}$.

$$C_{tot} \approx C_d + C_{PAR} \quad (3)$$

The sensor capacitance value $C_d$ may be solved e.g. from the following equation:

$$\frac{1}{C_d} = \frac{1}{C_1} + \frac{1}{C_2} \quad (4)$$

The capacitance $C_1$ of the first sensor capacitor C1 may be substantially equal to the capacitance $C_2$ of the second sensor capacitor C2. In that case the sensor capacitor value $C_d$ may be substantially equal to 50% of the capacitance $C_1$, i.e. $C_d = 0.5 \cdot C_1$.

The effect of the parasitic capacitors C51, C52 on the parasitic capacitance value $C_{PAR}$ may be estimated e.g. by the following approximate equation:

$$\frac{1}{C_{PAR}} \approx \frac{1}{C_{51}} + \frac{1}{C_{52}} \quad (5)$$

Equations (3) and (5) are approximate e.g. due to the impedance between the portions POR50a, POR50b. The impedance of the path PTH50 may cause a difference between the value of $C_{tot}$ calculated by equation (3) and the actual value of the parasitic capacitance value $C_{PAR}$. The impedance of the path PTH50 may cause a difference between the value of $C_{PAR}$ calculated by equation (5) and the actual value of the parasitic capacitance value $C_{PAR}$.

The capacitance $C_{51}$ of the first parasitic capacitor C51 may be substantially equal to the capacitance $C_{52}$ of the second parasitic capacitor C52. In that case the parasitic capacitance value $C_{PAR}$ may be substantially equal to 50% of the capacitance $C_{51}$, i.e. $C_{PAR} = 0.5 \cdot C_{51}$.

The capacitance monitoring unit 410 may be arranged to monitor the total capacitance $C_{tot}$ of the capacitor circuit CIR1. Input nodes N1, N2 of the monitoring unit 410 may be connected to the capacitor circuit CIR2 by conductors CONa, CONb. The parasitic capacitance $C_{PAR}$ may depend e.g. on the temperature of the substrate 50 so that variations of the parasitic capacitance $C_{PAR}$ may disturb monitoring the mirror gap based on the total capacitance $C_{tot}$.

In principle, the operating temperature of the substrate could be measured, and the disturbing effect might be compensated based on the operating temperature by using device-specific calibration data. However, this could increase manufacturing costs of the interferometer, and may make operation of the interferometer more complex.

Figure 5A:
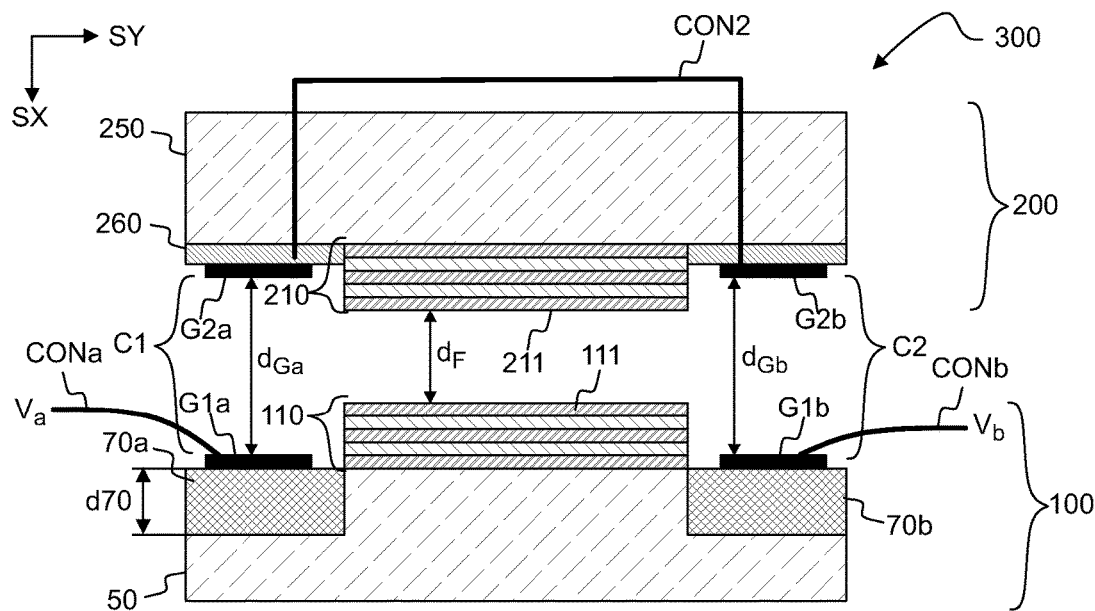
FIG. 5b shows, by way of example, in a cross-sectional side view, parasitic capacitors of the Fabry-Perot interferometer of FIG. 5a, FIG. 5c shows a capacitor circuit, which represents the interferometer of FIG. 5a, FIGS. 6a to 6g show, by way of example, in a cross-sectional side view, steps for producing a mirror plate, which comprises passivated regions.
Figure 5B:
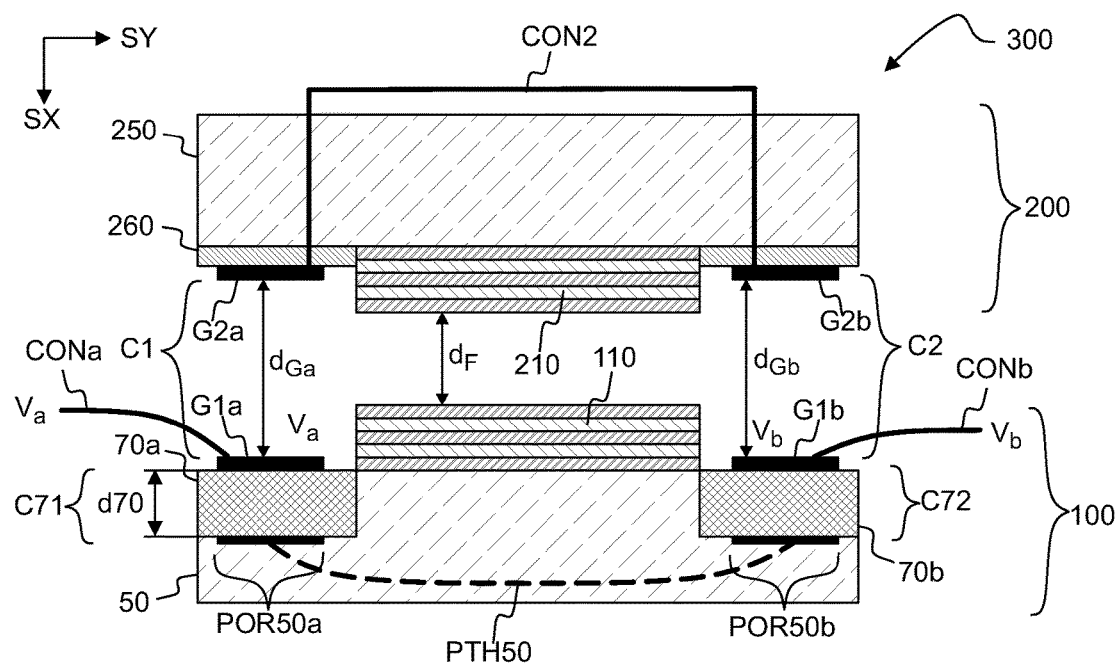

FIGS. 5a and 5b show a Fabry-Perot interferometer, which comprises passivated regions 70a, 70b. The passivated regions 70a, 70b may e.g. consist of essentially passivated porous silicon. The effect of the parasitic capacitors may be reduced or eliminated by increasing the distance between the electrode G1a and the supporting portion POR50a. The mirror plate 100 may comprise a passivated region 70a, which separates the electrode G1a from the supporting portion POR50a. d70 denotes the thickness of the region 70a and/or 70b. The thickness d70 of the passivated region 70a, 70b may be e.g. greater than 10 µm, greater than 20 µm, greater than 50 µm, or even greater than 100 µm. The thickness d70 of the region 70a, 70b may be e.g. in the range of 20 µm to 200 µm. The thickness d70 of the region 70a, 70b may be e.g. in the range of 10 µm to 200 µm.

The first mirror plate 100 may comprise a semi-transparent reflective coating 110. The second mirror plate 200 may comprise a semi-transparent reflective coating 210. The mirror gap $d_F$ may denote the distance between the coatings 110, 210. The mirror gap $d_F$ may denote the distance between the outer surfaces of the coatings 110, 210. The outer surface may also be called e.g. as a solid-gas interface, i.e. as an interface between a solid and a gas.

The substrate 50 may consist essentially of silicon (Si). The electrode G1a, G1b may comprise conductive material. The material of the electrodes G1a, G1b may be e.g. gold, silver, copper, aluminum, or polysilicon. The electrode G1a, G1b may consist essentially of metal.

The electrical conductivity of the passivated region 70a, 70b may be substantially lower than the electrical conductivity of the solid (non-porous) silicon of the substrate 50. The electrical conductivity $\sigma_{70}$ of the passivated region 70a may be e.g. lower than 20% of the electrical conductivity $\sigma_{Si}$ of the silicon of the substrate 50 at the temperature of 25° C.

A first sensor electrode G1a may be formed on the first passivated region 70a. A second sensor electrode G1b may be formed on the second passivated region 70b. The electrical conductivity of the electrodes G1a, G1b may be substantially higher than the electrical conductivity of solid (non-porous) silicon of the substrate 50. The electrodes G1a, G1b may be formed e.g. by physical vapor deposition (PVD), by chemical vapor deposition (CVD), and/or by atomic layer deposition (ALD). In particular, the electrodes G1a, G1b may be formed by sputtering.

The second mirror plate 200 of the interferometer 300 may comprise sensor electrode G2a and G2b. The sensor electrodes G1a and G2a may together form a first sensor capacitor C1, which has a capacitance $C_1$. The sensor electrodes G1b and G2b may together form a second sensor capacitor C2, which has a capacitance $C_2$. The capacitances $C_1$, $C_2$ may depend on the mirror gap $d_F$.

To the first approximation, the sensor capacitance $C_1$ may be inversely proportional to the distance $d_{Ga}$ between the electrodes:

$$C_1 \propto 1/d_{Ga} \quad (6)$$

Referring to FIG. 5b, the electrode G2a may be galvanically connected to the electrode G2b. For example, the electrode G2a may be connected to the electrode G2b by a conductor CON2. The electrodes G2a, G2b may also be portions of the same conductive layer. $V_a$ denotes the voltage of the electrode G1a. $V_b$ denotes the voltage of the electrode G1b.

Figure 5C:
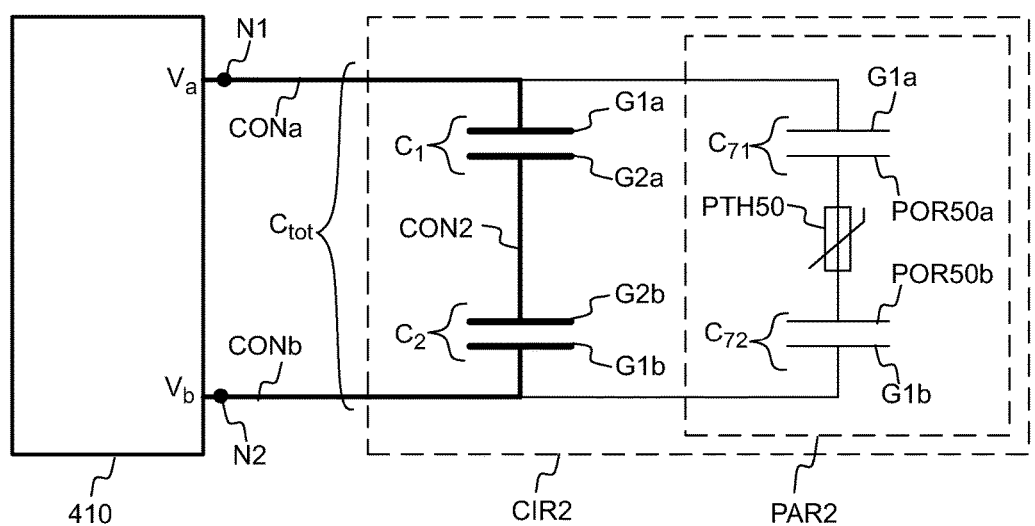

FIG. 5c shows a capacitor circuit CIR2 connected to a capacitance monitoring unit 410. The circuit CIR2 represents the interferometer 300 shown in FIGS. 5a and 5b.

A monitoring unit 410 may be connected to the circuit CIR2 in order to monitor the capacitance of the circuit CIR2.

The monitoring unit 410 may have input nodes N1, N2. The electrode G1a of the first sensor capacitor C1 may be connected to the input node N1 by the conductor CONa. The electrode G1b of the second sensor capacitor C2 may be connected to the input node N2 by the conductor CONb. The electrode G2a of the first sensor capacitor C1 may be connected to the electrode G2b of the second sensor capacitor C2.

The sensor electrode G1a and the supporting portion POR50a may form a first parasitic capacitor C71. The sensor electrode G1b and the supporting portion POR50b may form a second parasitic capacitor C72. A parasitic circuit PAR2 may comprise the first parasitic capacitor C71 and the second parasitic capacitor C72 such that the parasitic capacitors C71, C72 are connected in series by the semi-conducting path PTH50. The conductivity of the semi-conducting path PTH50 may vary. For example, the conductivity of the semi-conducting path PTH50 may depend on the temperature. The parasitic capacitor circuit PAR2 may have a parasitic capacitance $C_{PAR}$.

The thickness d70 of the passivated regions 70a, 70b may be selected such that the effect of the variations of the conductivity of the path PTH50 on the total capacitance $C_{tot}$ is sufficiently low. The thickness d70 of the passivated regions 70a, 70b may be selected such that the effect of the variations of the impedance of the path PTH50 on the total capacitance $C_{tot}$ is sufficiently low.

The total capacitance $C_{tot}$ of the capacitor circuit CIR2 may be approximately equal to the sum of the sensor capacitance value $C_d$ and the parasitic capacitance value $C_{PAR}$.

$$C_{tot} \approx C_d + C_{PAR} \quad (7)$$

Equation (7) is approximate e.g. due to the impedance of the semi-conducting path PTH50.

The sensor capacitance value $C_d$ may be solved e.g. from the following equation:

$$\frac{1}{C_d} = \frac{1}{C_1} + \frac{1}{C_2} \quad (8)$$

In an embodiment, the capacitance $C_1$ of the first sensor capacitor C1 may be substantially equal to the capacitance $C_2$ of the second sensor capacitor C2. In that case the sensor capacitor value $C_d$ may be substantially equal to 50% of the capacitance $C_1$, i.e. $C_d \approx 0.5 \cdot C_1$.

The parasitic capacitance value $C_{PAR}$ may be estimated e.g. by using the following approximate equation:

$$\frac{1}{C_{PAR}} \approx \frac{1}{C_{71}} + \frac{1}{C_{72}} \quad (9)$$

In an embodiment, the capacitance $C_{71}$ of the first parasitic capacitor C71 may be substantially equal to the capacitance $C_{72}$ of the second parasitic capacitor C72. In that case the parasitic capacitance value $C_{PAR}$ may be substantially equal to 50% of the capacitance $C_{71}$, i.e. $C_{PAR} \approx 0.5 \cdot C_{71}$.

The capacitance monitoring unit 410 may be arranged to monitor the total capacitance $C_{tot}$ of the capacitor circuit CIR2. Input nodes N1, N2 of the monitoring circuit 410 may be connected to the capacitor circuit CIR2. The input node N1 may be connected to the electrode G1a by the conductor CONa. The input node N2 may be connected to the electrode G1b by the conductor CONb.

Thanks to the passivated regions 70a, 70b, the parasitic capacitance $C_{PAR}$ may be lower than the sensor capacitance $C_d$. The thickness d70 of the passivated regions 70a, 70b may be selected such that the effect of the variations of the conductivity of the path PTH50 on the total capacitance $C_{tot}$ is sufficiently low. In an embodiment, the total capacitance $C_{tot}$ may be substantially independent of the conductivity of the semi-conducting path PTH50.

In an embodiment, the second passivated region 70b may be omitted. The plate 100 may comprise the electrodes G1a, G1b and a passivated region 70a such that the region 70a de-couples the electrode G1a from the substrate 50, wherein the electrode G1b may be directly in contact with the substrate 50.

Yet, the plate 100 may comprise the electrodes G1a, G1b and a passivated region 70a such that the region 70a de-couples the electrode G1a from the substrate 50, wherein the electrode G1b may be insulated from the substrate 50 by a layer of solid silica.

However, using a first passivated region 70a and a second passivated region 70b may provide higher accuracy for monitoring the mirror gap.

In an embodiment, a first conductor CONa may be galvanically connected to the electrode G1a of the first mirror plate 100, and an additional conductor may be galvanically connected to the electrode G2a of the second mirror plate 200. A capacitance monitoring unit 410 may be arranged to monitor the first sensor capacitor C1 by using the first conductor CONa and the additional conductor. Consequently, the first sensor capacitor C1 may be monitored directly by the capacitance monitoring unit 410. A second conductor CONb may be galvanically connected to the second electrode G1b of the first mirror plate 100, and an additional conductor may be galvanically connected to the electrode G2b of the second mirror plate 200. A capacitance monitoring unit 410 may be arranged to monitor the second sensor capacitor C2 by using the second conductor CONb and the additional conductor. The same capacitance monitoring unit 410 or different capacitance monitoring units may be used for monitoring the sensor capacitors C1, C2. The same additional conductor or different additional conductors may be used for monitoring the sensor capacitors C1, C2. The additional conductor or conductors may be flexible in order to allow movement of the second mirror plate 200. The passivated region 70a may reduce or prevent capacitive coupling from the electrode G1a to the electrode G1b also when the first sensor capacitor C1 is monitored by using the additional conductor.

The passivated regions 70a, 70b may suppress capacitive coupling from a sensor electrode to the substrate. The passivated regions 70a, 70b may be formed before the reflective mirror coating 110 is deposited on the substrate 50. The reflective mirror coating 110 may be e.g. a metal coating or a dielectric multilayer coating. The sensor electrodes G1a, G1b may be subsequently formed on top of the passivated regions 70a, 70b. The passivated regions 70a, 70b may also be formed after the reflective mirror coating 110 is deposited on the substrate. When forming the passivated regions 70a, 70b, the reflective mirror coating 110 may be temporarily protected by a mask layer. The protective mask layer may comprise e.g. silicon nitride. The porous silicon can be formed in well-defined patterns by using a hard mask, for example silicon nitride and/or by exploiting different etching of p- and n-type silicon.

The passivated region 70a, 70b may comprise passivated three-dimensional microstructure. The microstructure may be formed by etching a plurality of microscopic voids in the silicon substrate, and by passivating the surfaces of the voids. The three-dimensional microstructure may comprise insulating material. The three-dimensional microstructure may comprise e.g. amorphous silica $SiO_2$. The three-dimensional microstructure of the region 70a, 70b may comprise e.g. a plurality of microscopic zones consisting of insulating material (e.g. $SiO_2$), a plurality of microscopic zones comprising silicon (Si), and/or plurality of microscopic expansion joints (E2).

The substrate of the plate may have a heterogeneous microstructure during the passivation and/or after the passivation. The passivated region 70a, 70b may have a heterogeneous microstructure. The passivated region 70a, 70b may comprise conformally coated microstructured silicon matrix. The conformally coated microstructured silicon matrix may comprise a silicon matrix and one or more conformal layers of insulating material. The silicon matrix may operate as a supporting structure for one or more conformal layers of insulating material. The conformal layers of insulating material may be formed e.g. by depositing insulating material on the silicon matrix and/or by oxidizing the silicon matrix.

The volume fraction of electrically insulating material in the passivated region 70a, 70b may be e.g. higher than 80%, or even higher than 95%. The mass fraction of electrically insulating material in the passivated region 70a, 70b may be e.g. higher than 80%, or even higher than 95%. The passivated region 70a, 70b may consist essentially of electrically insulating material.

Forming the passivated region 70a, 70b may comprise:
  forming a plurality of voids in the substrate 50 by etching, and
  providing insulating material on the surfaces of the voids.
Forming the passivated region 70a, 70b may comprise:
  forming a plurality of voids in the substrate 50 by etching, and
  oxidizing the surfaces of the voids.
Forming the passivated region 70a, 70b may comprise:
  forming a plurality of voids in the substrate 50 by etching, and
  depositing insulating material on the surfaces of the voids.

In particular, passivated region 70a, 70b may comprise passivated porous silicon, and forming the passivated region 70a, 70b may comprise:
  converting silicon into porous silicon by etching, and
  passivating the surfaces of the pores of the porous silicon.

The microstructure of the region 70a, 70b may comprise e.g. a plurality of microscopic zones consisting of insulating material (e.g. $SiO_2$), and a plurality of microscopic zones comprising silicon (Si). The region 70a, 70b may comprise a conformally coated microstructured silicon matrix.

The microstructure of the region 70a, 70b may comprise e.g. a plurality of microscopic zones consisting of insulating material (e.g. $SiO_2$), and a plurality of expansion joints (E2).

The microstructure of the region 70a, 70b may comprise a plurality of microscopic zones consisting of insulating material (e.g. $SiO_2$), a plurality of microscopic zones comprising silicon (Si), and a plurality of microscopic expansion joints (E2).

FIGS. 6a to 6h show method steps for forming passivated regions 70a, 70b by etching and depositing insulating material on the surfaces of the voids.

Figure 6A:
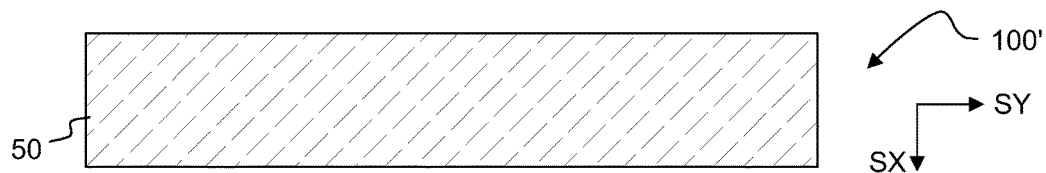
FIG. 6h shows, by way of example, method steps for producing a mirror plate, which comprises passivated regions.

FIG. 6a shows a substrate 50. The substrate 50 may consist essentially of silicon (Si). The substrate 50 may consist of silicon. The substrate 50 may comprise an uppermost layer, which consists essentially of silicon. The symbol 100' denotes a semi-manufactured mirror plate.

Figure 6B:
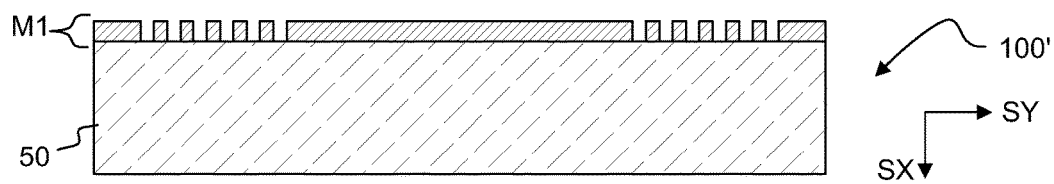

Referring to FIG. 6b, a mask layer M1 may be formed on the substrate 50. The mask layer M1 may be formed e.g. by depositing silicon nitride (SiN) on the substrate 50. The mask layer M1 may be patterned according to the desired locations of the passivated regions 70a, 70b. The mask layer M1 may be patterned according to the desired locations of the voids E1.

Figure 6C:
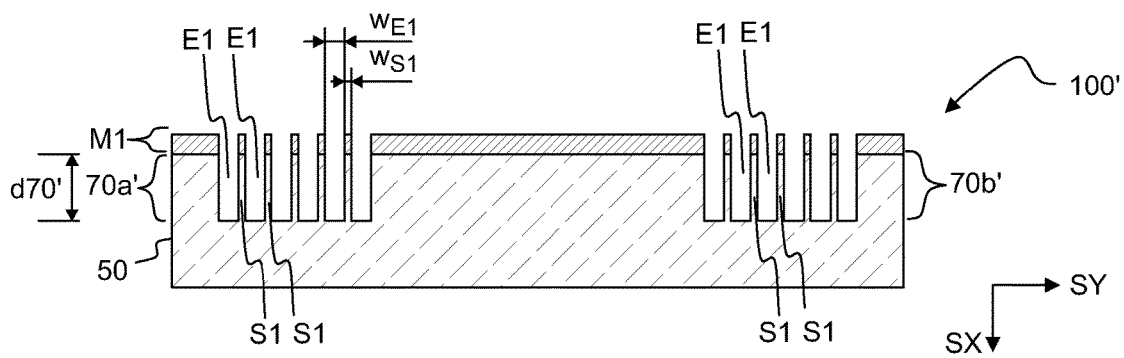

Referring to FIG. 6c, the material of the substrate 50 may be locally etched away to form a plurality of voids E1. The voids E1 may be formed e.g. by electrochemical etching, by reactive ion etching (RIE), or by deep reactive ion etching (DRIE).

The voids E1 formed by etching may be e.g. grooves, holes, channels and/or pores. The thickness d70' of the etched region may be e.g. higher than 10 µm. The depth of the grooves, holes, and/or channels may be higher than 10 µm (in the direction SX). When the voids are pores, a plurality of interconnected open pores may be formed e.g. by electrochemical etching. The interconnected pores may form channels, which extend deep into the substrate. For example, the interconnected pores may extend to a depth, which is higher than 10 µm.

The inner widths $w_{E1}$ of the microscopic voids E1 may be e.g. smaller than 100 µm in a transverse direction (e.g. in the direction SY), preferably smaller than 10 µm. The small inner widths $w_{E1}$ of the microscopic voids E1 may e.g. facilitate rapid filling of the voids E1 by deposition. The narrow widths $w_{E1}$ may e.g. facilitate defining the position of the sensor electrode G1a with respect to the substrate 50 (see FIG. 6g).

The inner widths $w_{E1}$ of the microscopic voids E1 may be e.g. in the range of 10 nm to 10 µm in a transverse direction (e.g. in the direction SY).

The widths $w_{S1}$ of the walls S1 between the voids may be smaller than 100 µm in a transverse direction (SY), preferably smaller than 10 µm. The narrow widths $w_{S1}$ of the walls S1 may reduce the impedance of the passivated region 70a. The narrow widths $w_{S1}$ of the walls S1 may facilitate rapid oxidation of the walls S1.

The widths $w_{S1}$ of the walls S1 between the voids may be e.g. in the range of 10 nm to 10 µm in a transverse direction (e.g. in the direction SY).

The voids E1 may have a relatively large surface area. The total surface area of the voids may be e.g. greater than 5 times the projected area of the passivated region 70a. The projected area of the passivated region 70a may mean the rectilinear parallel projection of the region 70a on a plane, which is parallel to the reflective coating 110 of the mirror plate 100 (FIG. 6g).

Figure 6D:
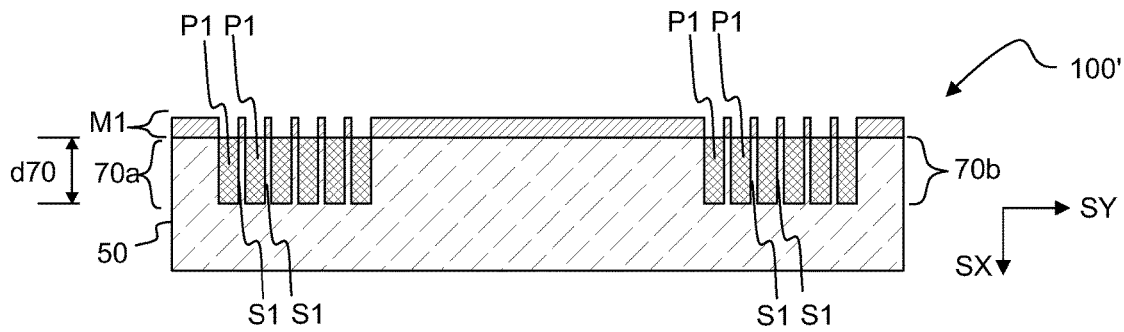

Referring to FIG. 6d, the surfaces of the voids E1 may be at least partly covered with insulating material P1 in order to stabilize the impedance of the passivated region 70a, 70b. The insulating material P1 may be deposited on the surfaces e.g. by atomic layer deposition (ALD) or by chemical vapor deposition (CVD).

Figure 6E:
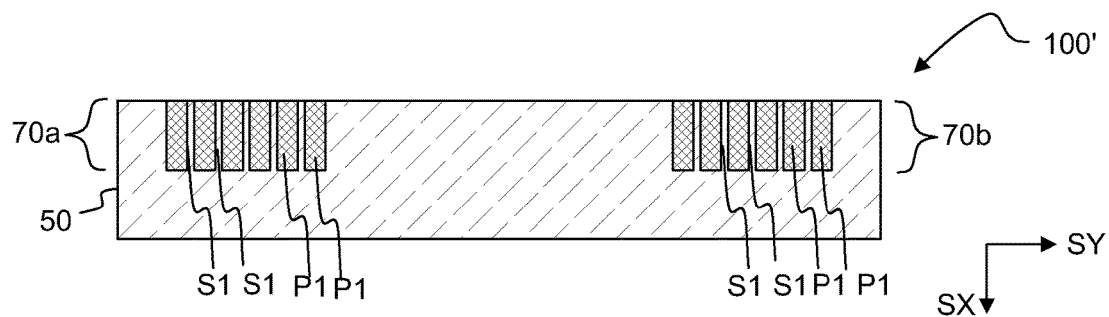

Referring to FIG. 6e, the mask layer M1 may be removed from the semi-manufactured plate 100'. The mask layer M1 may be removed e.g. by etching.

Figure 6F:
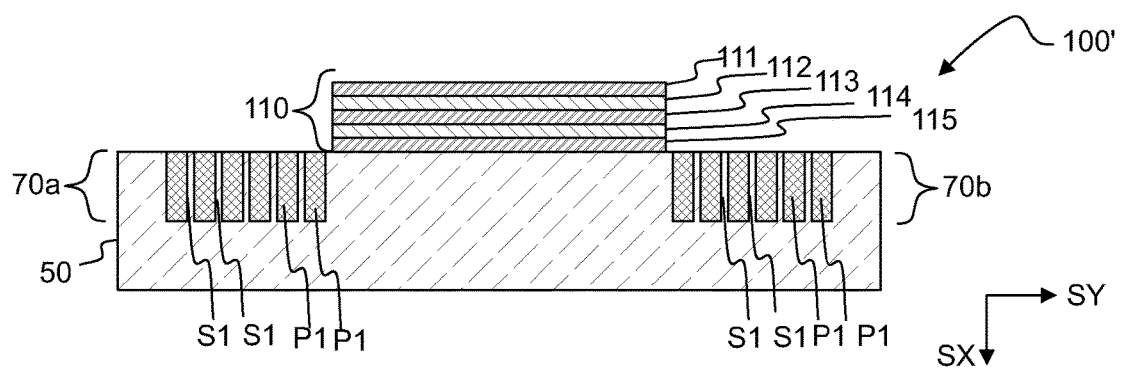
Figure 6G:
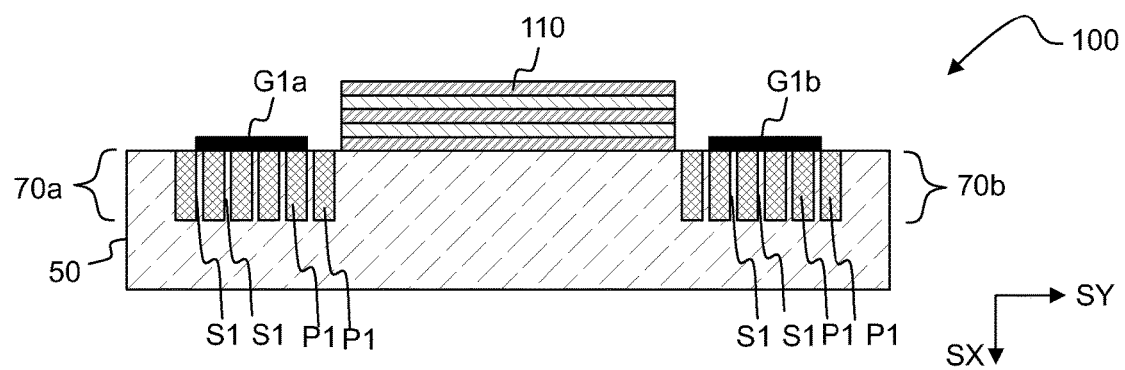

Referring to FIG. 6f, the reflective coating 110 may be produced on the substrate 50. The reflective coating 110 may be a dielectric multilayer coating. The reflective coating 110 may comprise e.g. layers 111, 112, 113, 114, 115.

Alternatively, the reflective coating 110 may also be formed before etching the voids E1.

Referring to FIG. 6g, the electrodes G1a, G1b may be formed on top of the passivated regions 70a, 70b e.g. by depositing metal or polysilicon. The upper surface may be covered with a continuous conductive layer, which may be subsequently patterned. Alternatively or in addition, only selected portions may be covered with a conductive layer.

The microstructure of the region 70a, 70b of the mirror plate 100 may comprise a plurality of microscopic zones consisting of insulating material (e.g. $SiO_2$), and a plurality of microscopic zones comprising silicon (Si). The region 70a, 70b may comprise a conformally coated microstructured silicon matrix.

The conductors CONa, CONb may be subsequently connected to the electrodes G1a, G1b. The conductors CONa, CONb may be bonded to the electrodes G1a, G1b.

Figure 6H:
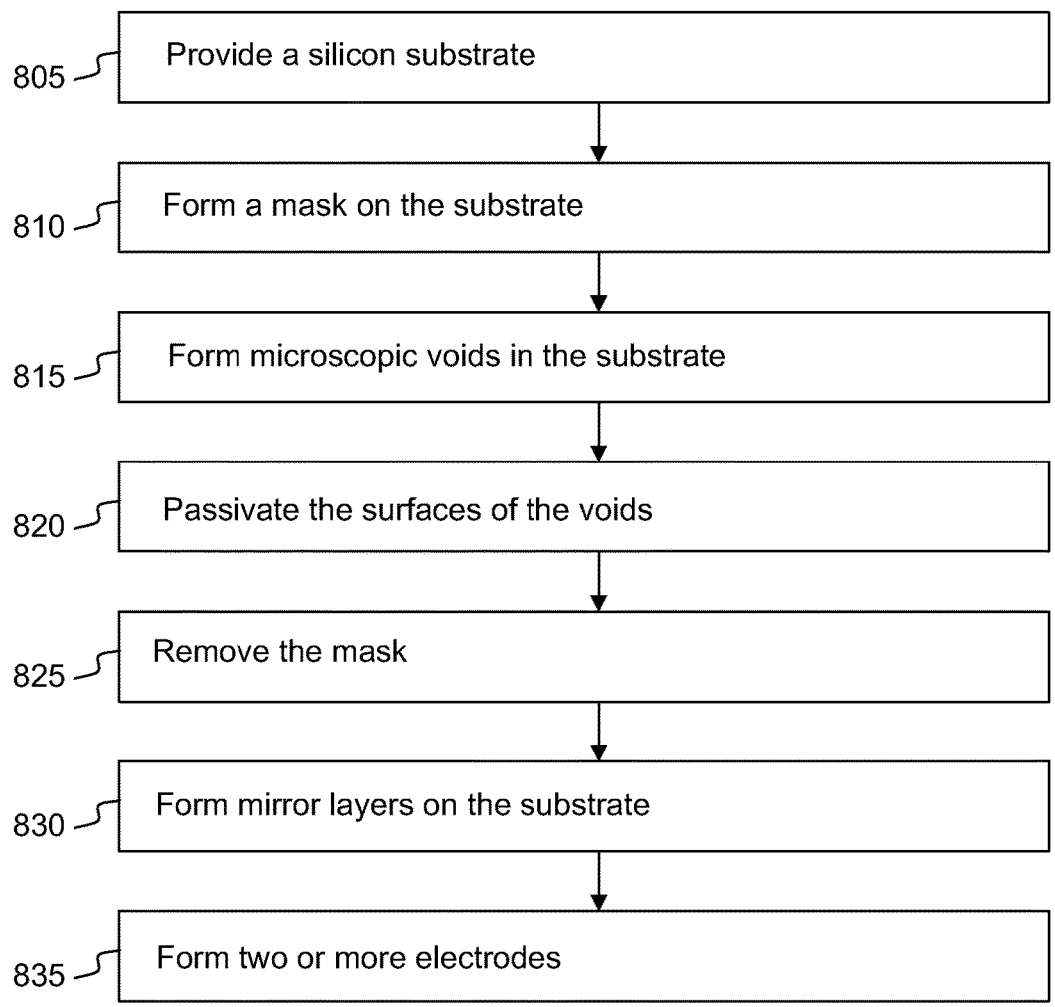

FIG. 6h shows method steps for producing a mirror plate, which comprises passivated regions 70a, 70b.

In step 805, the silicon substrate 50 may be provided.

In step 810, the mask M1 may be formed.

In step 815, a plurality of microscopic voids E1 may be formed in the substrate 50 by etching.

In step 820, the surfaces of the voids E1 may be passivated e.g. by depositing insulating material P1 on the surfaces.

In step 825, the mask M1 may be removed.

In step 830, the reflective coating 110 may be formed on the substrate 50.

In step 835, the electrodes G1a, G1b may be formed on the passivated regions 70a, 70b.

FIGS. 7a to 7h show method steps for forming passivated regions 70a, 70b by etching and oxidation.

Figure 7A:
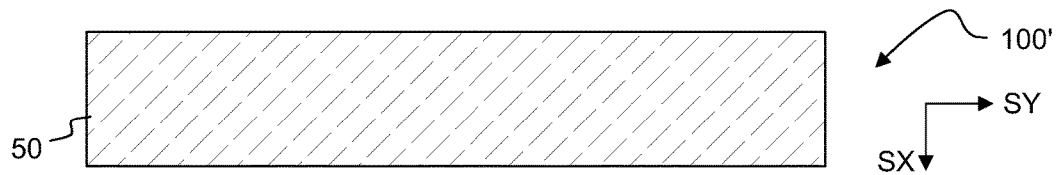
FIGS. 7a to 7g show, by way of example, in a cross-sectional side view, steps for producing a mirror plate, which comprises passivated regions formed by oxidation.

FIG. 7a shows a substrate 50. The substrate 50 may consist essentially of silicon (Si). The substrate 50 may consist of silicon. The substrate 50 may comprise an uppermost layer, which consists essentially of silicon. The symbol 100' denotes a semi-manufactured mirror plate.

Figure 7B:
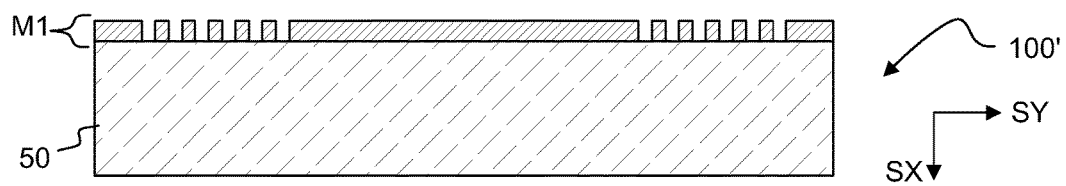

Referring to FIG. 7b, a mask layer M1 may be formed on the substrate 50. The mask layer M1 may be formed e.g. by depositing silicon nitride (SiN) on the substrate 50. The mask layer M1 may be patterned according to the desired locations of the passivated regions 70a, 70b. The mask layer M1 may be patterned according to the desired locations of the voids E1.

Figure 7C:
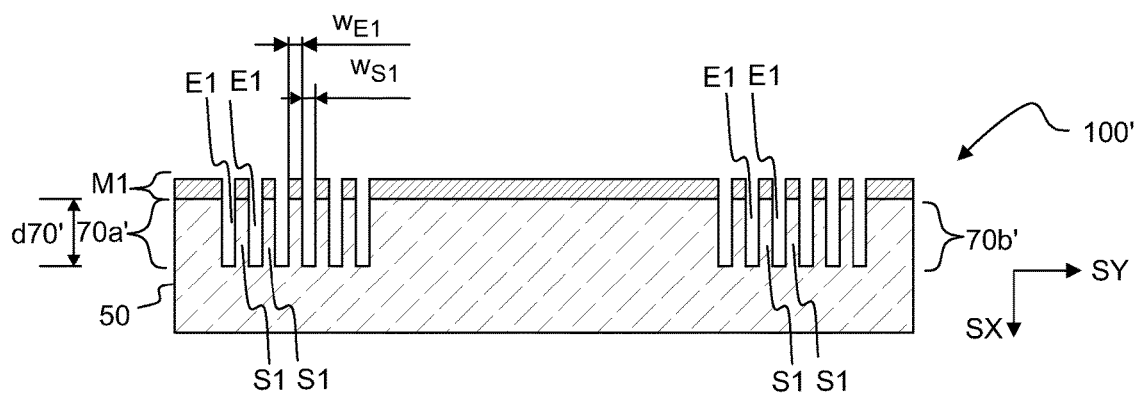

Referring to FIG. 7c, the material of the substrate 50 may be locally etched away to form a plurality of voids E1. The voids E1 may be formed e.g. by electrochemical etching, by reactive ion etching (RIE), or by deep reactive ion etching (DRIE).

The voids E1 formed by etching may be e.g. grooves, holes, channels and/or pores. The thickness d70' of the etched region may be e.g. higher than 10 µm. The inner widths $w_{E1}$ of the microscopic voids E1 may be e.g. smaller than 100 µm in a transverse direction (e.g. in the direction SY), preferably smaller than 10 µm. The narrow widths $w_{E1}$ may e.g. facilitate defining the position of the sensor electrode G1a with respect to the substrate 50. The inner widths $w_{E1}$ of the microscopic voids E1 may be e.g. in the range of 10 nm to 10 µm in a transverse direction (e.g. in the direction SY). The widths $w_{S1}$ of the walls S1 between the voids may be smaller than 100 µm in a transverse direction (SY), preferably smaller than 10 µm. The widths $w_{S1}$ of the walls S1 between the voids may be e.g. in the range of 10 nm to 10 µm in a transverse direction (e.g. in the direction SY). The small widths $w_{S1}$ of the walls S1 may e.g. facilitate oxidation of the walls S1. The total surface area of the voids may be e.g. greater than 5 times the projected area of the passivated region 70a.

Figure 7D:
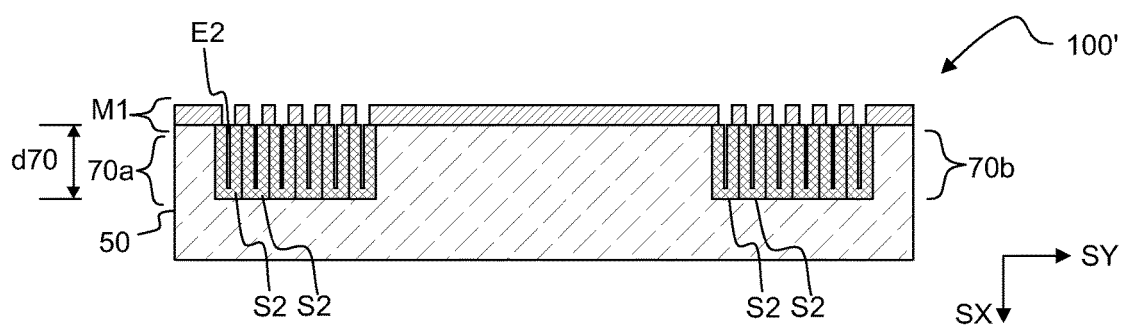

Referring to FIG. 7d, the surfaces of the voids E1 may be at least partly converted into insulating material S2 by oxidizing the surfaces. S2 denotes the insulating material ($SiO_2$) formed by the oxidation. After the etching but before the oxidation, the walls S1 between the voids E1 may consist essentially of silicon Si. The material of the walls S1 may be at least partly converted into silica $SiO_2$ by oxidation. The oxidation of the silicon may also increase volume of the material so that the voids E1 may be at least partly filled with the silica $SiO_2$. In other words, the oxidation may cause swelling of the material of the walls S1.

The distance between opposing walls S1 of a void E1 may be reduced due to the deposition or oxidation, until a residual void or expansion joint E2 remains between the opposing walls. The regions 70a, 70b may comprise optionally residual voids or joints E2 after oxidation. The residual voids or joints E2 may facilitate reducing and/or controlling mechanical stress in the region 70a, 70b. The regions 70a, 70b may comprise a plurality of expansion joints E2.

Figure 7E:
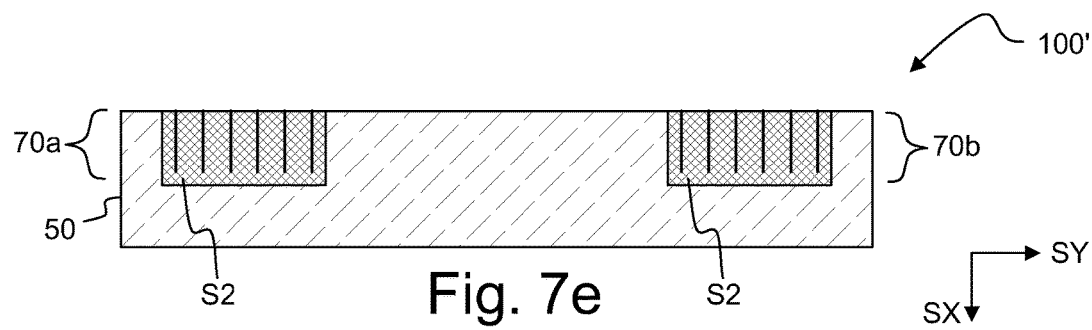

Referring to FIG. 7e, the mask layer M1 may be removed from the semi-manufactured plate 100'. The mask layer M1 may be removed e.g. by etching.

Figure 7F:
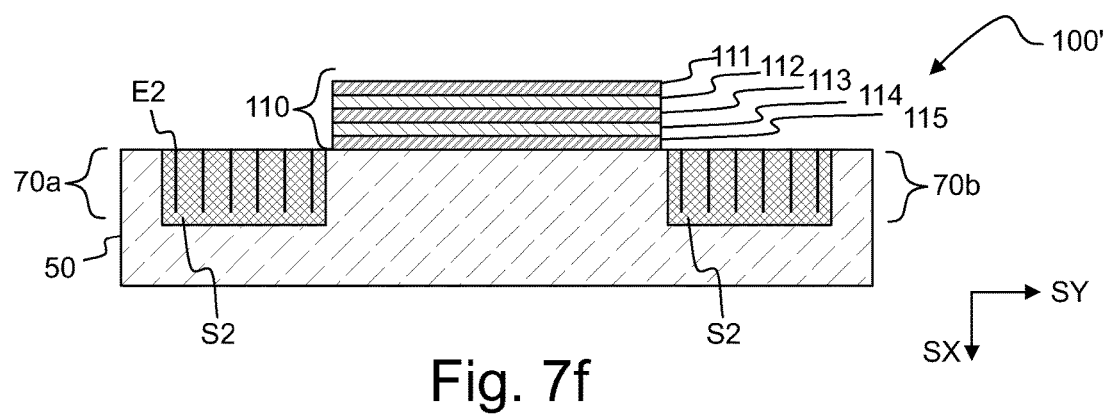

Referring to FIG. 7f, the reflective coating 110 may be produced on the substrate 50. The reflective coating 110 may be a dielectric multilayer coating. The reflective coating 110 may comprise e.g. layers 111, 112, 113, 114, 115.

The reflective coating 110 may also be formed before etching the voids E1.

The microstructure of the region 70a, 70b of the mirror plate 100 may comprise a plurality of microscopic zones consisting of insulating material (e.g. $SiO_2$), and a plurality of expansion joints (E2). The region 70a, 70b may comprise a conformally coated microstructured silicon matrix.

The microstructure of the region 70a, 70b may comprise a plurality of microscopic zones consisting of insulating material (e.g. $SiO_2$), a plurality of microscopic zones comprising silicon (Si), and a plurality of microscopic expansion joints (E2).

Figure 7G:
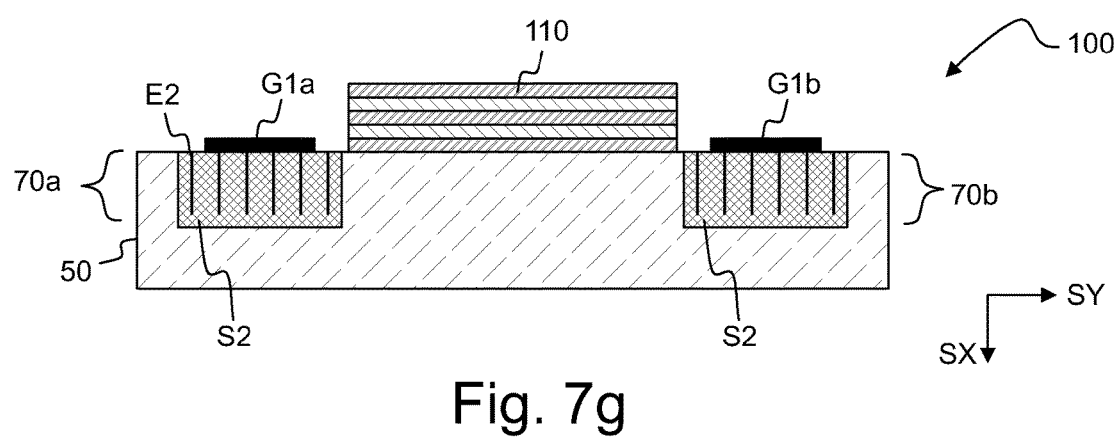

Referring to FIG. 7g, the electrodes G1a, G1b may be formed on top of the passivated regions 70a, 70b e.g. by depositing metal or polysilicon. The upper surface may be covered with a continuous conductive layer, which may be subsequently patterned. Alternatively or in addition, only selected portions may be covered with a conductive layer.

The conductors CONa, CONb may be subsequently connected to the electrodes G1a, G1b. The conductors CONa, CONb may be bonded to the electrodes G1a, G1b.

Figure 7H:
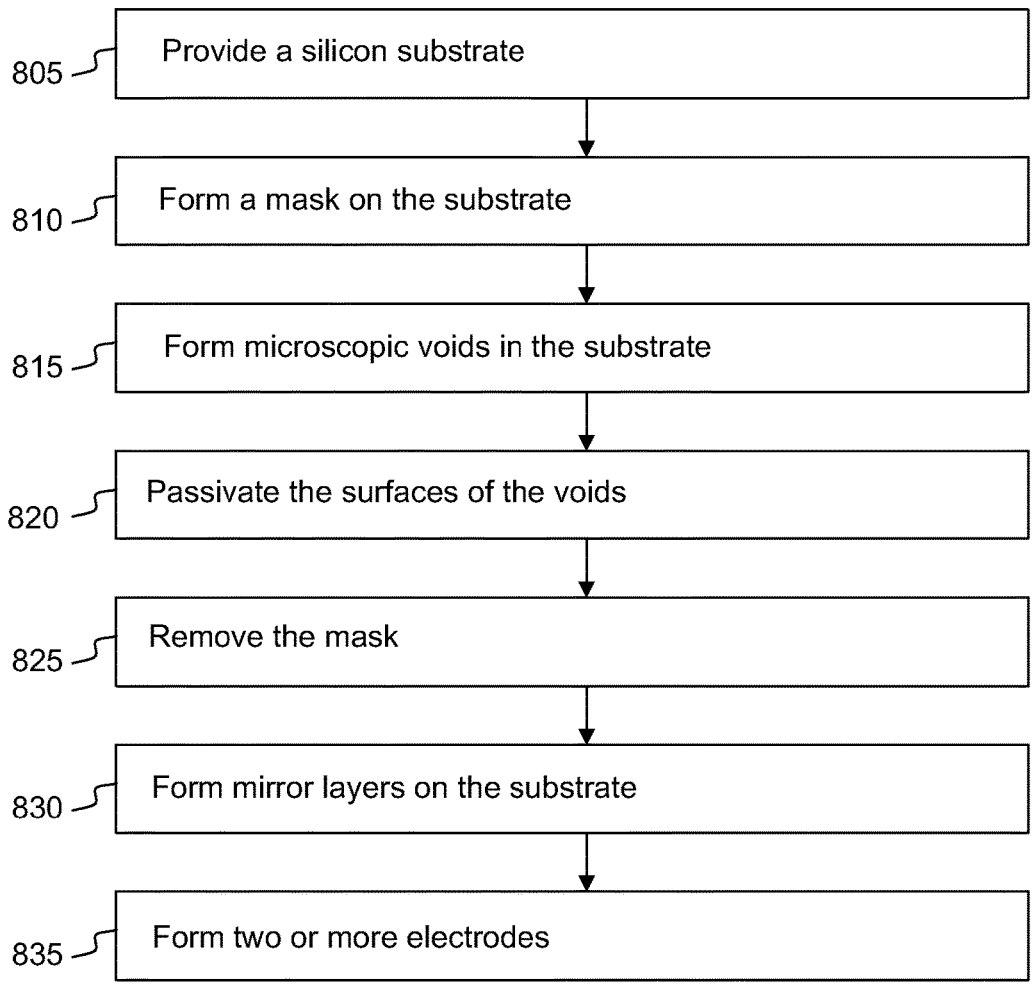
FIG. 7h shows, by way of example, method steps for producing a mirror plate, which comprises passivated regions formed by oxidation.

FIG. 7h shows method steps for producing a mirror plate, which comprises passivated regions 70a, 70b.

In step 805, the silicon substrate 50 may be provided.

In step 810, the mask M1 may be formed.

In step 815, a plurality of microscopic voids E1 may be formed in the substrate 50 by etching.

In step 820, the surfaces of the voids E1 may be passivated e.g. by oxidation.

In step 825, the mask M1 may be removed.

In step 830, the reflective coating 110 may be formed on the substrate 50.

In step 835, the electrodes G1a, G1b may be formed on the passivated regions 70a, 70b.

FIGS. 8a to 8f, and FIGS. 9a to 9f show method steps for forming passivated regions 70a, 70b, which comprise passivated porous silicon.

Solid silicon may be converted into porous silicon e.g. by etching. The porous silicon may be formed e.g. by electrochemical etching. The porous silicon may be subsequently passivated in order to reduce the electrical conductivity of the porous material, in order to stabilize electrical properties of the porous material and/or in order to reduce the dielectric constant of the porous material. The porous silicon may be passivated e.g. by oxidation and/or by deposition. The porous silicon may be passivated e.g. by thermal oxidation. The deposition may be performed e.g. by chemical vapor deposition (CVD) or by atomic layer deposition (ALD).

Figure 8A:
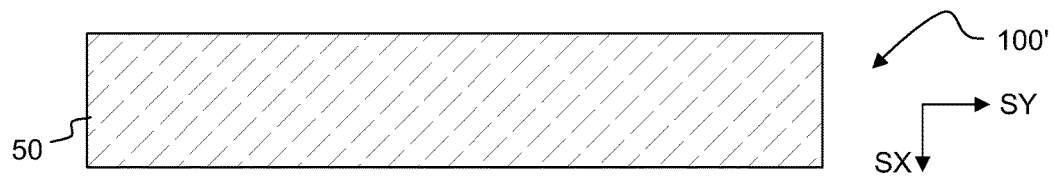
FIGS. 8a to 8g show, by way of example, in a cross-sectional side view, steps for producing a mirror plate, which comprises passivated porous silicon.

FIG. 8a shows a substrate 50. The substrate 50 may consist essentially of silicon (Si). The substrate 50 may consist of silicon. The substrate 50 may comprise an uppermost layer, which consists essentially of silicon.

Figure 8B:
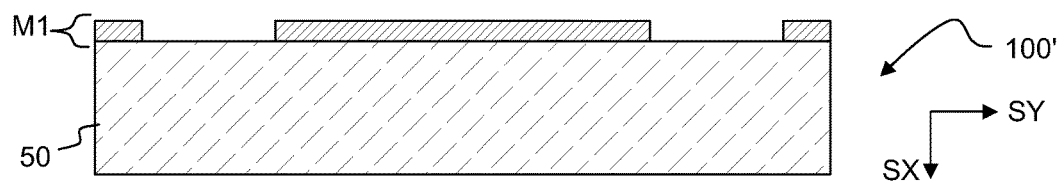

Referring to FIG. 8b, a mask layer M1 may be formed on the substrate 50. The mask layer M1 may be formed e.g. by depositing silicon nitride (SiN) on the substrate 50. The mask layer M1 may be patterned according to the desired locations of the passivated regions 70a, 70b.

Figure 8C:
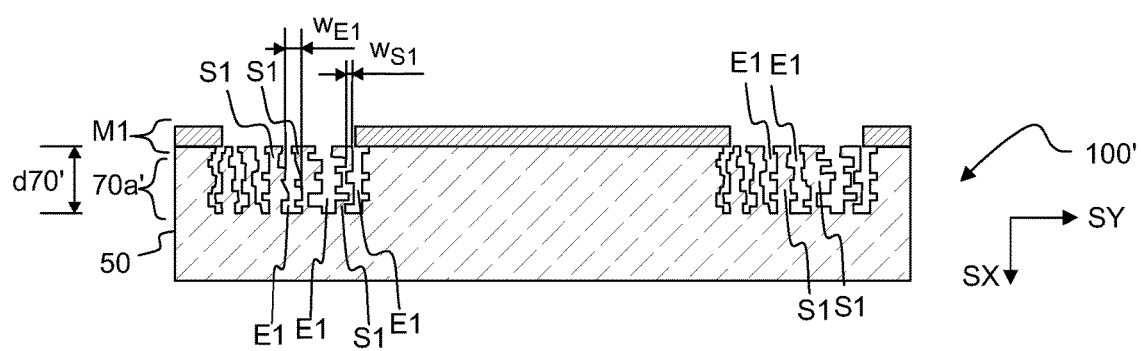

Referring to FIG. 8c, the material of the substrate 50 may be locally converted into porous silicon e.g. by electrochemical etching, to form porous portions 70a', 70b'. The porous portions 70a', 70b' may comprise porous silicon. A plurality of interconnected open pores E1 may be formed e.g. by electrochemical etching. The interconnected pores E1 may form channels, which extend deep into the substrate. For example, the interconnected pores E1 may extend to a depth, which is higher than 10 µm.

The inner widths $w_{E1}$ of the pores E1 may be e.g. smaller than 100 µm in a transverse direction (e.g. in the direction SY), preferably smaller than 10 µm. The narrow widths $w_{E1}$ may e.g. facilitate defining the position of the sensor electrode G1a with respect to the substrate 50. The inner widths $w_{E1}$ may be e.g. in the range of 10 nm to 10 µm in a transverse direction (e.g. in the direction SY). The widths $w_{S1}$ of the walls S1 between the pores E1 may be smaller than 100 µm in a transverse direction (SY), preferably smaller than 10 µm. The narrow widths $w_{S1}$ of the walls S1 may reduce the impedance of the passivated region 70a. The narrow widths $w_{S1}$ of the walls S1 may facilitate rapid oxidation of the walls S1. The widths $w_{S1}$ of the walls S1 may be e.g. in the range of 10 nm to 10 µm in a transverse direction (e.g. in the direction SY).

Figure 8D:
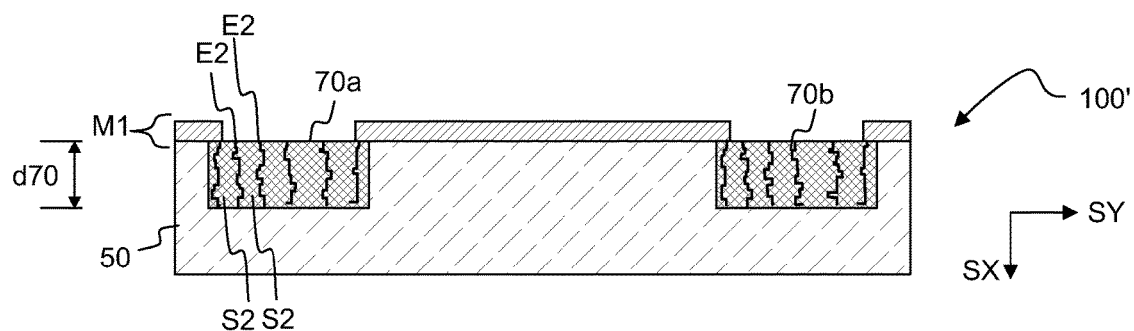

Referring to FIG. 8d, the porous silicon may be passivated. The passivated regions 70a, 70b may be formed e.g. by passivating the porous silicon of the porous portions 70a', 70b'. The porous silicon may be passivated e.g. by depositing insulating material on the surfaces of the pores E1 and/or by oxidizing the walls S1 between the pores E1. The oxidation may at least partly convert the silicon Si of the walls S1 into silica $SiO_2$. S2 denotes the insulating material ($SiO_2$) formed by the oxidation.

The regions 70a, 70b may comprise optionally residual voids E2 or joints E2. The residual voids or joints E2 may facilitate controlling mechanical stress in the region 70a, 70b. The regions 70a, 70b may comprise expansion joints E2

Figure 8E:
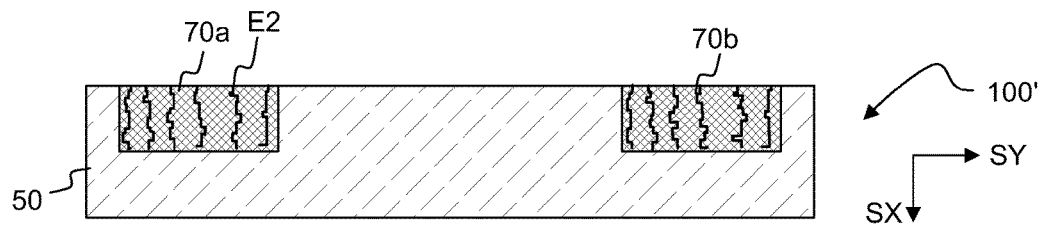

Referring to FIG. 8e, the mask layer M1 may be removed from the semi-manufactured plate 100'. The mask layer M1 may be removed by etching.

Figure 8F:
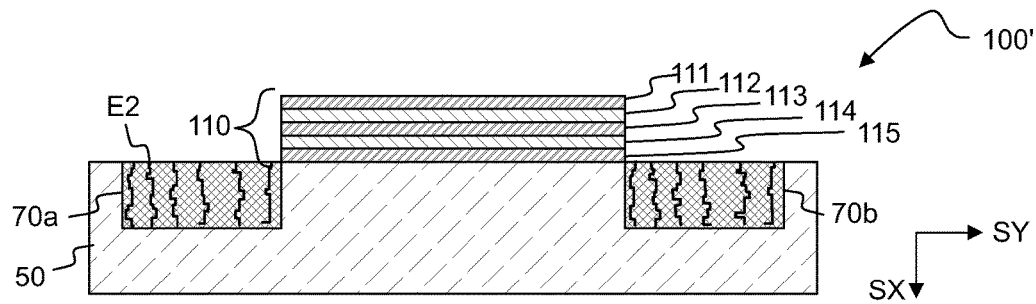

Referring to FIG. 8f, the reflective coating 110 may be produced on the substrate 50. The reflective coating 110 may be a dielectric multilayer coating. The reflective coating 110 may comprise e.g. layers 111, 112, 113, 114, 115.

Figure 8G:
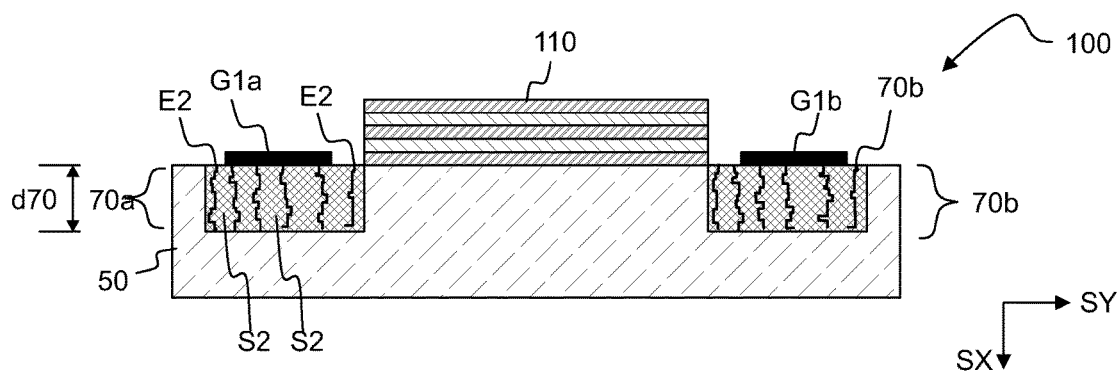

Referring to FIG. 8g, the electrodes G1a, G1b may be formed on top of the passivated regions 70a, 70b e.g. by depositing metal or polysilicon. The upper surface may be covered with a continuous conductive layer, which may be subsequently patterned. Alternatively or in addition, only selected portions may be covered with a conductive layer.

The conductors CONa, CONb may be subsequently connected to the electrodes G1a, G1b. The conductors CONa, CONb may be bonded to the electrodes G1a, G1b.

The microstructure of the region 70a, 70b of the mirror plate 100 may comprise a plurality of microscopic zones consisting of insulating material (e.g. $SiO_2$), and a plurality of expansion joints (E2). The microstructure of the region 70a, 70b may comprise a plurality of microscopic zones consisting of insulating material (e.g. $SiO_2$), a plurality of microscopic zones comprising silicon (Si), and a plurality of microscopic expansion joints (E2). The region 70a, 70b may comprise a conformally coated microstructured silicon matrix.

Figure 8H:
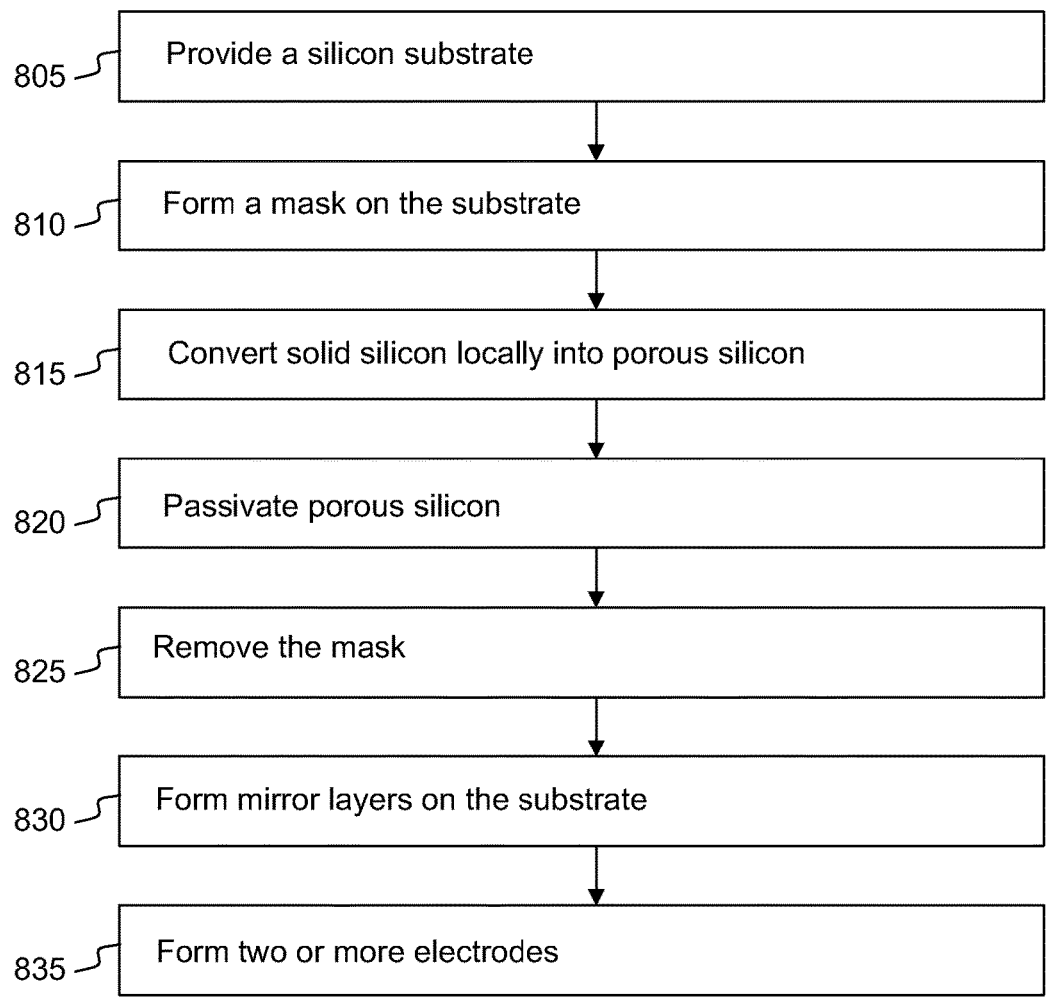
FIG. 8h shows, by way of example, method steps for producing a mirror plate, which comprises passivated porous silicon.

FIG. 8h shows method steps for producing a mirror plate, which comprises passivated regions 70a, 70b.

In step 805, the silicon substrate 50 may be provided.

In step 810, the mask M1 may be formed.

In step 815, the solid silicon of the substrate 50 may be locally converted into porous silicon.

In step 820, the passivated regions 70a, 70b may be formed by passivating the porous silicon. The passivation may comprise oxidizing the walls S1 of the pores E1 and/or depositing insulating material P1 on the surfaces of the pores E1. Oxidation may partly fill the pores E1.

In step 825, the mask M1 may be removed.

In step 830, the reflective coating 110 may be formed on the substrate 50.

In step 835, the electrodes G1a, G1b may be formed on the passivated regions 70a, 70b.

FIGS. 9a to 9f show producing a mirror plate 100 such that the passivated regions 70a, 70b are formed after the material layers of the reflective coating have been deposited.

Figure 9A:
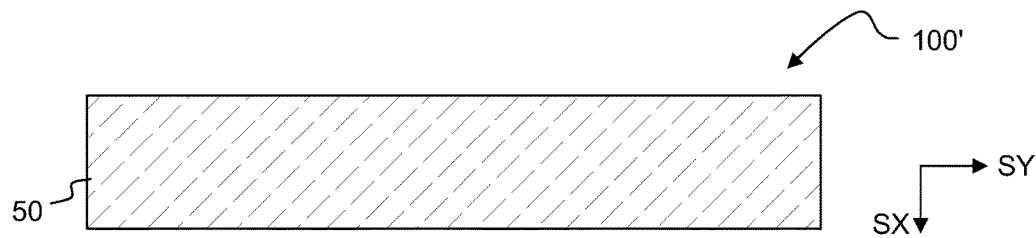
FIGS. 9a to 9g show, by way of example, in a cross-sectional side view, method steps for producing a mirror plate, which comprises passivated porous silicon.

Referring to FIG. 9a, a silicon substrate 50 may be provided.

Figure 9B:
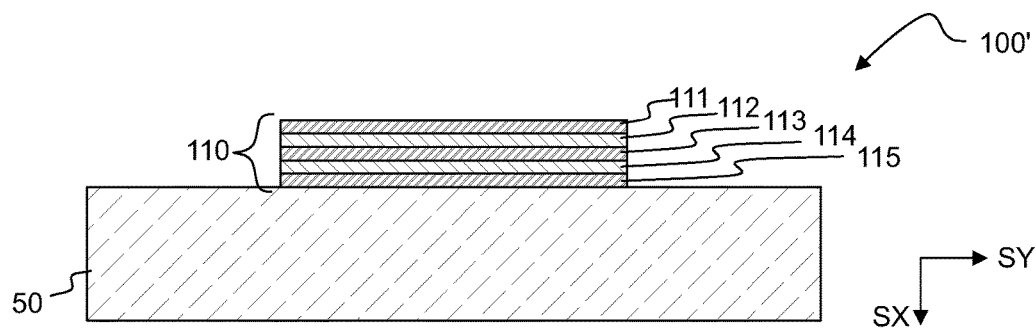

Referring to FIG. 9b, the reflective coating 110 may be formed on the substrate 50. The coating 50 may comprise e.g. material layers 111, 112, 113, 114, 115. The material layers may be deposited on the substrate 50.

Figure 9C:
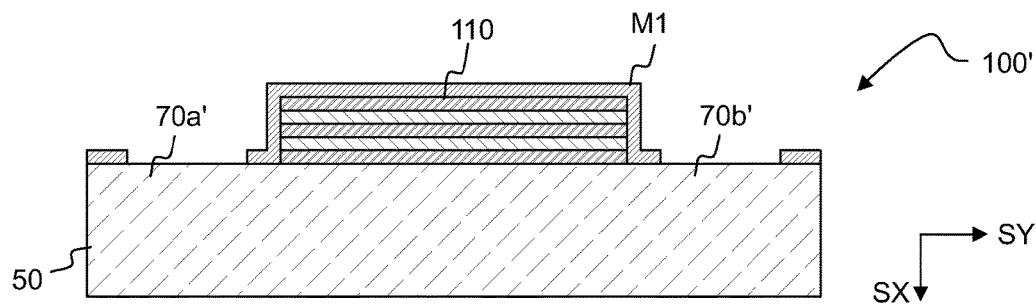

Referring to FIG. 9c, a patterned mask layer M1 may be formed on the substrate 50 and the coating 110. The mask layer M1 may be formed e.g. by depositing silicon nitride (SiN) on the substrate 50.

Figure 9D:
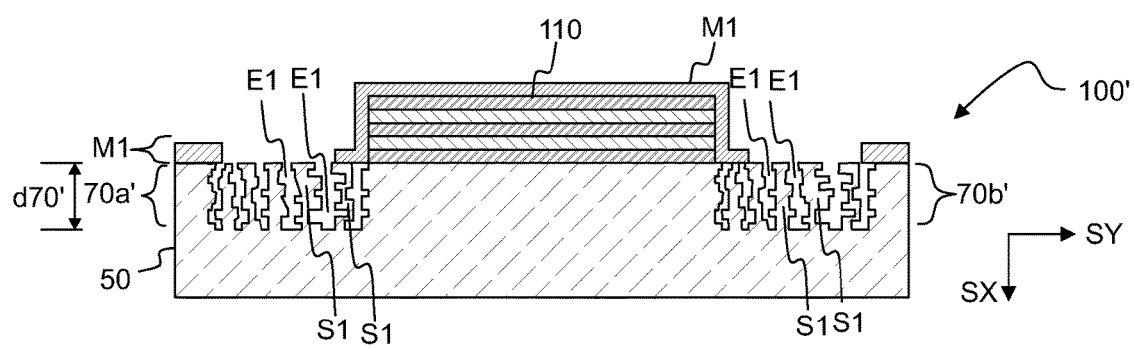

Referring to FIG. 9d, the silicon of the substrate 50 may be locally converted into porous silicon 70a' 70b' e.g. by electrochemical etching.

The inner widths $w_{E1}$ of the pores E1 may be e.g. smaller than 100 µm in a transverse direction (e.g. in the direction SY), preferably smaller than 10 µm. The narrow widths $w_{E1}$ may e.g. facilitate defining the position of the sensor electrode G1a with respect to the substrate 50. The inner widths $w_{E1}$ may be e.g. in the range of 10 nm to 10 µm in a transverse direction (e.g. in the direction SY). The widths $w_{S1}$ of the walls S1 between the pores E1 may be smaller than 100 µm in a transverse direction (SY), preferably smaller than 10 µm. The narrow widths $w_{S1}$ of the walls S1 may reduce the impedance of the passivated region 70a. The narrow widths $w_{S1}$ of the walls S1 may facilitate rapid oxidation of the walls S1. The widths $w_{S1}$ of the walls S1 may be e.g. in the range of 10 nm to 10 µm in a transverse direction (e.g. in the direction SY).

Figure 9E:
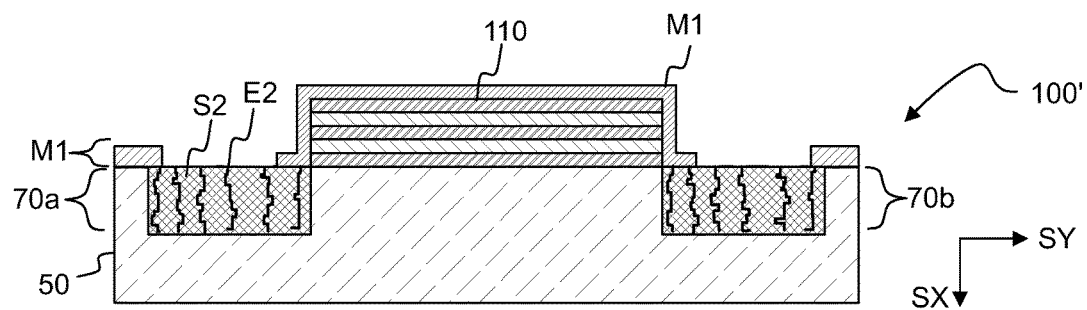

Referring to FIG. 9e, the passivated regions 70a, 70b may be formed by passivating the porous silicon. The porous silicon may be passivated e.g. by depositing material on the surfaces of the pores E1 and/or by oxidizing the walls S1 between the pores E1. S2 denotes insulating material ($SiO_2$) formed by the oxidation.

Figure 9F:
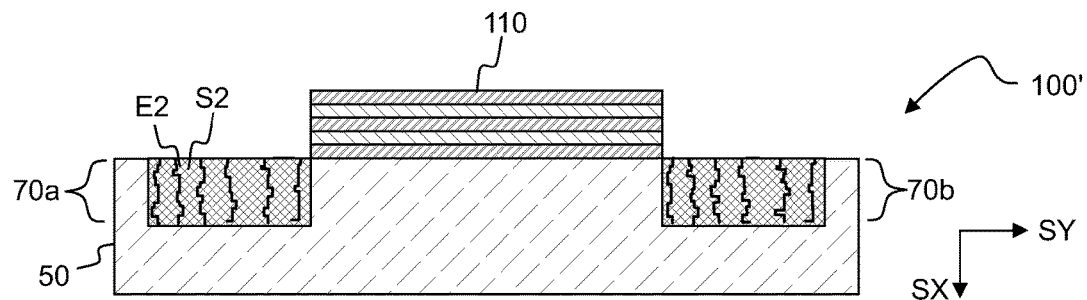

Referring to FIG. 9f, the mask layer M1 may be removed from the semi-manufactured mirror plate 100'.

Figure 9G:
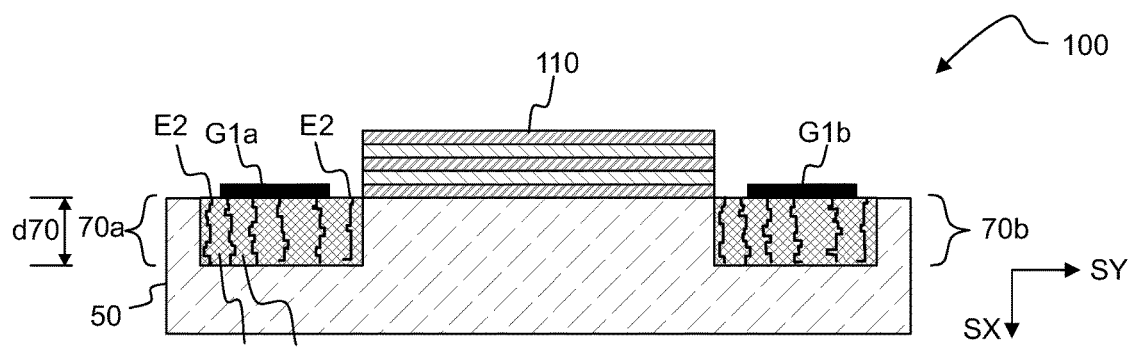

Referring to FIG. 9g, the electrodes G1a, G1b may be formed on the passivated regions 70a, 70b. The region 70a, 70*b* may comprise a conformally coated microstructured silicon matrix. The electrodes G1*a*, G1*b* may be formed e.g. by depositing a metal layer on the passivated region 70*a*, 70*b*. The upper surface may be covered with a continuous metal layer, which may be subsequently patterned. Alternatively or in addition, only selected portions may be covered with a metal layer.

Figure 9H:
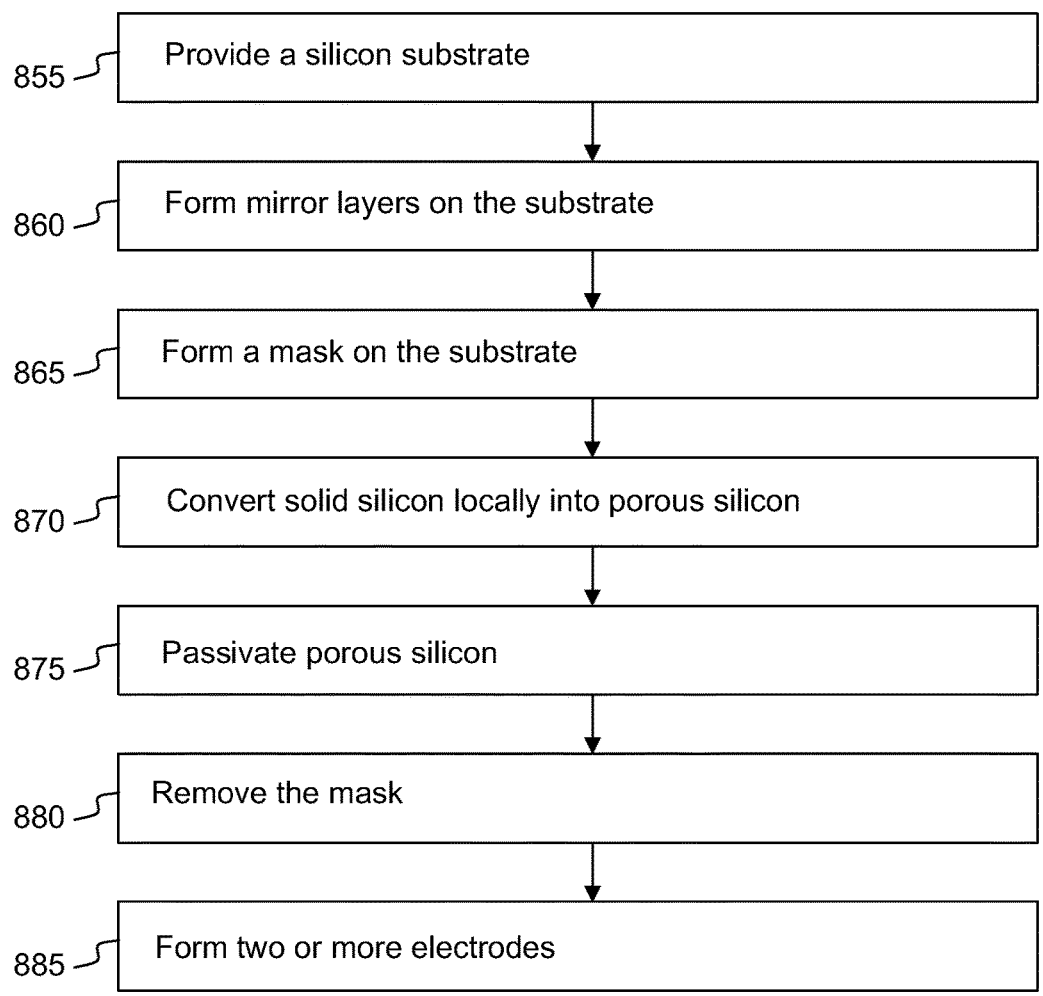
FIG. 9h shows, by way of example, method steps for producing a mirror plate, which comprises passivated porous silicon.

FIG. 9*h* shows method steps for producing a mirror plate, which comprises passivated regions.

A silicon substrate 50 may be provided in step 855.

In step 860, the reflective coating 110 may be formed on the substrate 50.

In step 865, the mask layer M1 may be formed.

In step 870, the solid silicon of the substrate 50 may be locally converted into porous silicon by electrochemical etching.

In step 875, the porous silicon may be passivated. The passivation may comprise oxidizing the walls S1 of the pores E1 and/or depositing insulating material P1 on the surfaces of the pores E1. Oxidation may partly fill the pores E1.

In step 880, the mask may be removed.

In step 885, the electrodes G1*a*, G1*b* may be formed on top of the passivated regions 70*a*, 70*b*.

Figure 10A:
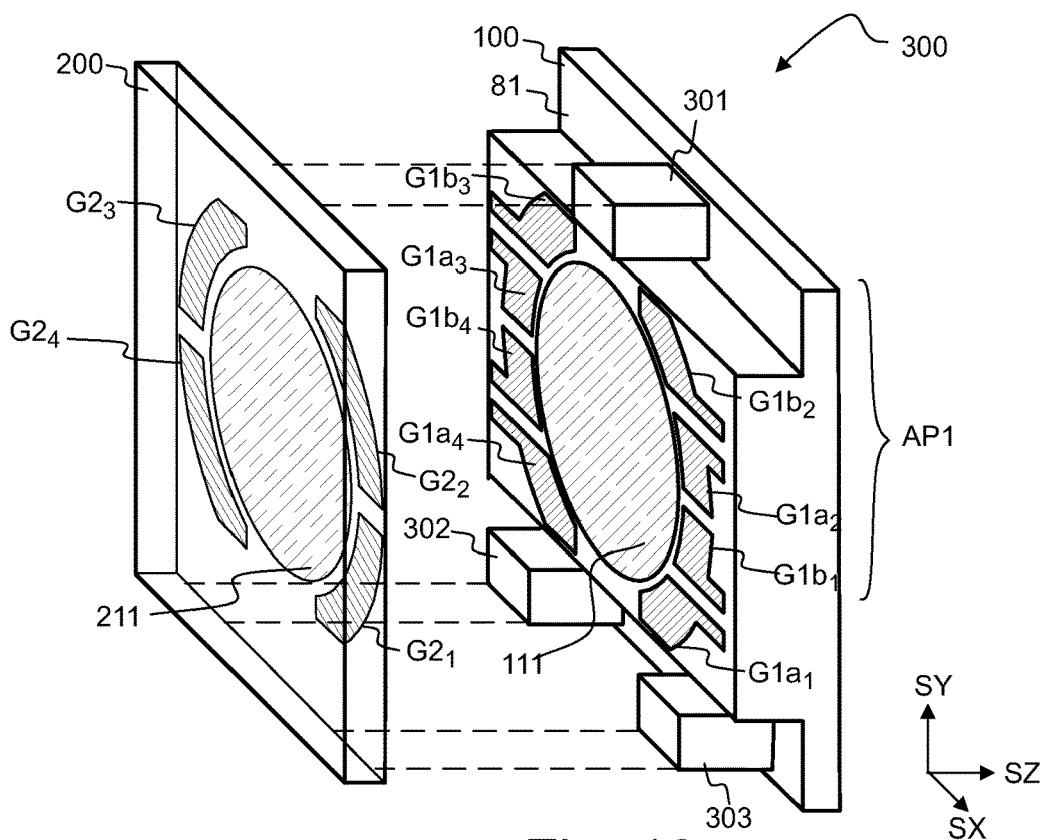
FIG. 10a shows, by way of example, in a three-dimensional exploded view, a first mirror plate and a second mirror plate of a Fabry-Perot interferometer.

FIG. 10*a* shows, by way of example, in a three-dimensional exploded view of a Fabry-Perot interferometer 300. The interferometer 300 may comprise a first mirror plate 100, a second mirror plate 200, and one or more actuators 301, 302, 303.

The first mirror plate 100 may have electrodes $G1a_1$, $G1b_1$, $G1a_2$, $G1b_2$, $G1a_3$, $G1b_3$, $G1a_4$, $G1b_4$. The second mirror plate 200 may have electrodes $G2_1$, $G2_2$, $G2_3$, $G2_4$. The electrodes $G1a_1$, $G1b_1$, $G1a_2$, $G1b_2$, $G1a_3$, $G1b_3$, $G1a_4$, $G1b_4$ may be implemented on top of one or more passivated regions 70*a*, 70*b* in order to prevent mutual electrical coupling via the substrate 50 of the first plate 100. The electrode $G1a_1$ may be implemented on top of a first passivated region 70*a*, and/or the electrode $G1b_1$ may be implemented on top of a second passivated region 70*b* in order to prevent mutual electrical coupling via the substrate 50 of the first plate 100.

The electrodes $G1a_1$, $G1b_1$, $G1a_2$, $G1b_2$, $G1a_3$, $G1b_3$, $G1a_4$, $G1b_4$, $G2_1$, $G2_2$, $G2_3$, $G2_4$ may be galvanically separate from each other. The electrode $G2_1$ may have electrode portions $G2a_1$, $G2b_1$. The electrode $G1a_1$ and the electrode portion $G2a_1$ may form a first sensor capacitor C1. The electrode $G1b_1$ and the electrode portion $G2b_1$ may form a second sensor capacitor C2. The sensor capacitors C1 and C2 are connected in series, and may together form a first sensor capacitor system, which has a capacitance Ca. The electrode $G1a_1$ may have a terminal $N1_1$, and the electrode $G1b_1$ may have a terminal $N2_1$. The capacitance $C_d$ may be monitored by using a monitoring unit 410, which is connected to the terminals $N1_1$, $N2_1$.

The second mirror plate 200 may comprise a reflective coating 210, which may have an outer layer 211. The second mirror plate 200 may have one or more electrodes $G2_1$, $G2_2$, $G2_3$, $G2_4$. The electrodes $G2_1$, $G2_2$, $G2_3$, $G2_4$ may be called e.g. as counter electrodes. The dimensions and the position of the electrode $G2_1$ may be selected such that the electrodes $G1a_1$ and $G1b_1$ at least partially overlap the counter-electrode $G2_1$ the interferometer 300 has been assembled.

The mirror plate 100 may optionally comprise a recessed portion 81 for providing space for an actuator 301, 302, 303.

Figure 10B:
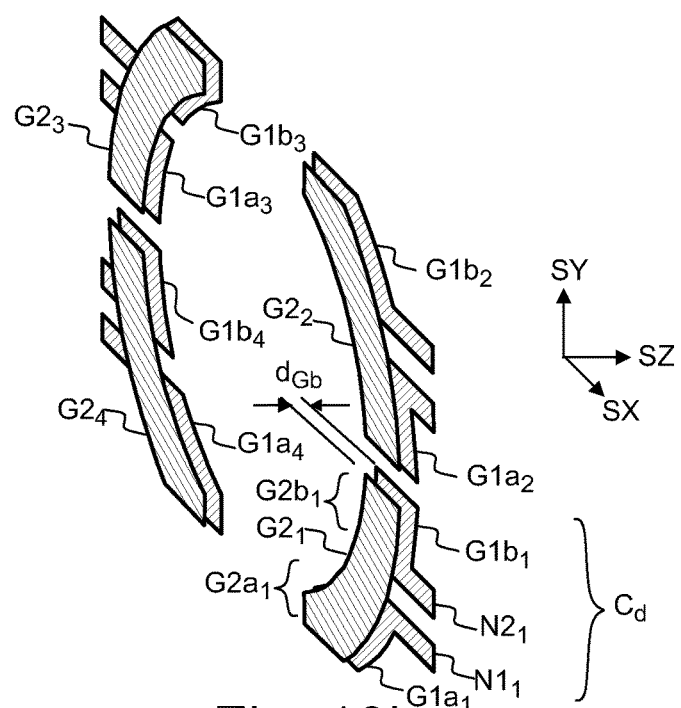
FIG. 10b shows, by way of example, in a three-dimensional view, the positions of the sensor electrodes of the Fabry-Perot interferometer of FIG. 10a, FIG. 11a shows, by way of example, a set-up for calibrating the mirror gap.

FIG. 10*b* shows, in a three-dimensional view, the positions of the counter electrodes $G2_1$, $G2_2$, $G2_3$, $G2_4$ with respect to the electrodes $G1a_1$, $G1b_1$, $G1a_2$, $G1b_2$, $G1a_3$, $G1b_3$, $G1a_4$, $G1b_4$.

The electrodes $G1a_1$, $G2_1$, and $G1b_1$ may be arranged to form a first sensor capacitor system, which has a capacitance $C_d$, which is indicative of the mirror gap $d_F$ at a first predetermined position of the aperture portion AP1. The monitoring unit 410 may be connected to the electrodes $G1a_1$ and $G1b_1$ by conductors CONa, CONb. The mirror plate 100 may be stationary. In an embodiment, it is not necessary to bond flexible conductors to the moving second mirror plate 200. The conductors CONa, CONb may be attached to the mirror plate 100, which may be immovable with respect to the capacitance monitoring unit 410.

The electrodes $G1a_2$, $G2_2$, and $G1b_2$ may form a second sensor capacitor system. The electrodes $G1a_3$, $G2_3$, and $G1b_3$ may form a third sensor capacitor system. The electrodes $G1a_4$, $G2_4$, and $G1b_4$ may form a fourth sensor capacitor system. Each sensor capacitor system may have terminal portions for connecting to a capacitance monitoring unit.

The sensor electrodes may be arranged to monitor the alignment of the second mirror plate 200 with respect to the first mirror plate 100. The Fabry-Perot interferometer may be operated such that the reflective coating 110 of the second plate 100 is substantially parallel to the reflective coating 210 of the first plate 200. The mutual parallelism of the plates 100, 200 may be monitored by comparing the capacitance of the second sensor capacitor system with the capacitance of the first sensor capacitance system. For example, a non-zero difference between the capacitance of the first sensor capacitor system and the capacitance of the second sensor capacitor system may indicate that the second plate 200 is tilted about the axis SX. For example, a non-zero difference between the capacitance of the second sensor capacitor system and the capacitance of the third sensor capacitor system may indicate that the second plate 200 is tilted about the axis SY.

The control unit CNT1 may be arranged to drive the actuators 301, 302, 303 such that the reflective coating 210 of the plate 200 may be kept substantially parallel to the reflective coating 110 of the plate 100. The control unit CNT1 may be arranged to drive the actuators 301, 302, 303 such that the reflective coating of the plate 200 may be kept substantially parallel to the reflective coating of the plate 100 during varying the mirror gap $d_F$.

In an embodiment, the interferometer 300 may comprise three sensor capacitor systems for monitoring a tilt angle of the plate 200 about the axis SX, for monitoring a tilt angle of the plate 200 about the axis SY, and for monitoring the spatially averaged value of the mirror gap $d_F$. A first tilt angle about the axis SX may be monitored e.g. by comparing the capacitance value of a first sensor capacitor system with the capacitance value of a second sensor capacitor system. A second tilt angle about the axis SY may be monitored e.g. by comparing the capacitance value of the second sensor capacitor system with the capacitance value of a third sensor capacitor system. The first sensor capacitor system may be formed e.g. by the electrodes $G1a_1$, $G2_1$, and $G1b_1$. The second sensor capacitor system may be formed e.g. by the electrodes $G1a_2$, $G2_2$, and $G1b_2$. The third sensor capacitor system may be formed e.g. by the electrodes $G1a_3$, $G2_3$, and $G1b_3$.

In an embodiment, also the electrodes $G2_1$, $G2_2$, $G2_3$, $G2_4$ may be implemented on top of passivated regions in order to prevent mutual electrical coupling via the substrate of the second plate 200. However, the second plate 200 does not need to comprise passivated regions e.g. in a situation where the sensor capacitors are not monitored simultaneously.

Figure 11A:
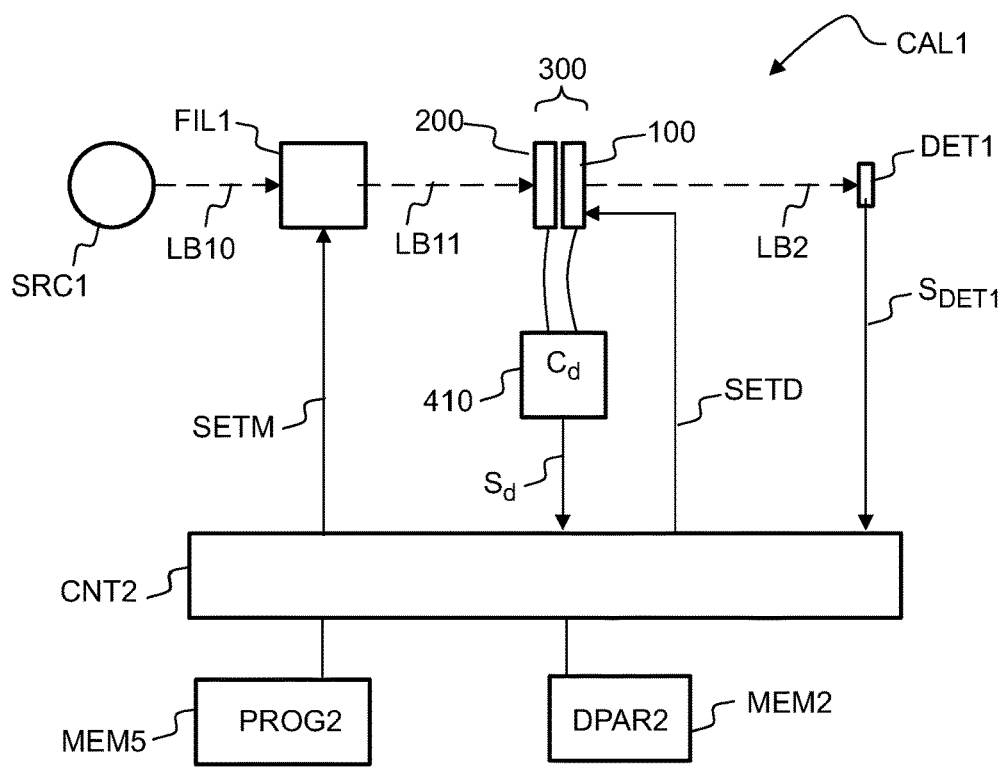
FIG. 11b shows, by way of example, spectral positions of the transmission peaks of the interferometer.

FIG. 11a shows a calibration system CAL1 for measuring a value of the sensor capacitance $C_d$ associated with a mirror gap $d_F$. The calibration system CAL1 may be arranged to provide sensor capacitance values $C_d$ associated with each relevant mirror gap $d_F$. The calibration system CAL1 may provide a sensor signal value $S_d$ associated with a mirror gap $d_F$. The calibration system CAL1 may provide sensor signal values $S_d$ associated with each relevant mirror gap $d_F$.

The calibration system CAL1 may be arranged to provide narrowband calibration light LB11. The calibration light LB11 may be substantially monochromatic. The calibration light LB11 has a wavelength $\lambda_M$. The wavelength $\lambda_M$ may be fixed or adjustable. The calibration light LB11 may be provided e.g. by filtering light LB10 of a broadband light source SRC1 with a monochromator FIL1. The interferometer 300 may provide transmitted light LB2 by filtering the calibration light LB11. An optical detector DET1 may be arranged to monitor the intensity of light LB2 transmitted through the Fabry-Perot interferometer 300. The detector DET1 may provide a detector signal $S_{DET1}$ indicative of the transmitted intensity.

The capacitance monitoring unit 410 may be arranged to provide a sensor signal $S_d$, which is indicative of the value of a sensor capacitance $C_d$. The system CAL1 may comprise a control unit CNT2, which may be arranged to change the wavelength $\lambda_M$ of the calibration light LB11 and/or the mirror gap $d_F$, and to monitor the detector signal $S_{DET1}$ as a function of the parameters $\lambda_M$ and $S_d$.

The calibration system CAL1 may comprise a memory MEM5 for storing computer program code PROG2, which when executed by one or more data processors may cause the system CAL1 to perform mirror gap calibration.

The relationship between each value of the sensor signal $S_d$ and the corresponding mirror gap $d_F$ may be stored in a memory MEM2 as one or more spectral calibration parameters DPAR2. The spectral calibration parameters DPAR2 may comprise e.g. a table, which contains a list of sensor signal values $S_d$ associated with respective mirror gap values $d_F$. The spectral calibration parameters DPAR2 may comprise e.g. a regression function, which may allow calculation of an estimate of the actual value of the mirror gap $d_F$ as a function of the sensor signal $S_d$. An estimate of the actual value of the mirror gap $d_F$ may be determined from the sensor signal $S_d$ by using said regression function. The spectral calibration parameters DPAR2 may comprise e.g. a regression function, which may allow calculation of the spectral position $\lambda_0$ of the transmittance peak PEAK1 as a function of the sensor signal $S_d$.

Figure 11B:
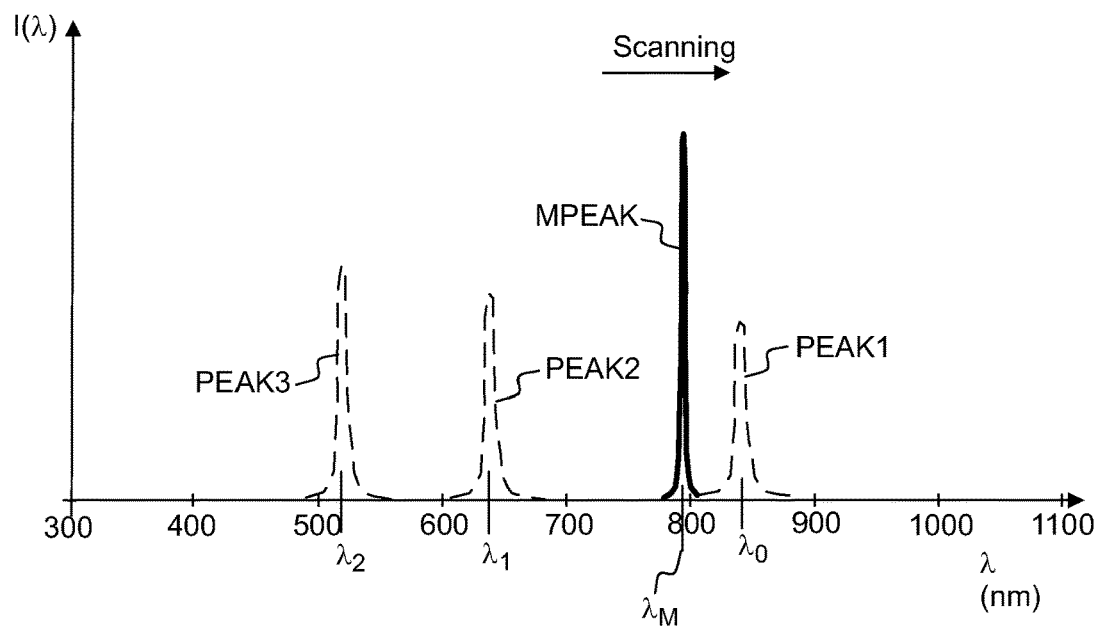

Referring to FIG. 11b, the spectral positions $\lambda_0$ of the transmission peaks PEAK1, PEAK2, PEAK3 of the interferometer may depend on the mirror gap $d_F$. The control unit CNT2 of the system CAL1 may adjust the monochromator FIL1 such that the narrowband calibration light LB11 has a desired (known) wavelength $\lambda_M$. The marking MPEAK denotes the spectral peak of the calibration light LB11. The control unit CNT2 may change the spectral position $\lambda_0$ of the transmission peak PEAK1 by changing the mirror gap $d_F$. The calibration may comprise varying the mirror gap $d_F$ and/or varying the wavelength $\lambda_M$. For example, the mirror gap $d_F$ may be varied while keeping the wavelength $\lambda_M$ constant. For example, the wavelength $\lambda_M$ may be varied while the mirror gap $d_F$ is kept constant. For example, the wavelength $\lambda_M$ and the mirror gap $d_F$ may be varied.

The intensity transmitted through the interferometer 300 may reach a maximum when the spectral position $\lambda_0$ of the transmission peak PEAK1 substantially coincides with wavelength $\lambda_M$ of the narrowband calibration light LB11. The control unit CNT2 may be arranged to scan the mirror gap $d_F$, and to determine a sensor signal value $S_d$ associated with the known wavelength $\lambda_M$ when $\lambda_0 = \lambda_M$, by monitoring when the transmitted intensity reaches a maximum.

The method may comprise varying the mirror gap $d_F$ and recording a capacitance value $C_d$ and/or a sensor signal value $S_d$, which is associated with maximum transmitted intensity. When the transmitted intensity reaches a (local) maximum, a mirror gap value $d_F$ can be determined from the wavelength $\lambda_M$ by using the Fabry-Perot transmission function and by using knowledge about the order of interference. The determined mirror gap value $d_F$ may be associated with the recorded capacitance value $C_d$. The determined mirror gap value $d_F$ may be associated with the recorded sensor signal value $S_d$. The wavelength $\lambda_M$ may be associated with the recorded capacitance value $C_d$. The wavelength $\lambda_M$ may be associated with the recorded sensor signal value $S_d$.

An associated pair of values $(C_d, d_F)$ may be used for providing a regression function, which allows determining the mirror gap as a function of the capacitance of the sensor capacitor. The associated pair of values $(S_d, d_F)$ may be used for providing a regression function, which allows determining the mirror gap as a function of the sensor signal. The associated pair of values $(C_d, \lambda_M)$ may be used for providing a regression function, which allows determining the wavelength of transmission peak as a function of the capacitance of the sensor capacitor. The associated pair of values $(S_d, \lambda_M)$ may be used for providing a regression function, which allows determining the wavelength of transmission peak as a function of the sensor signal. Several pairs of values $(C_d, d_F)$ may be measured. The regression function may be determined based on several pairs of values $(C_d, d_F)$. Spectral calibration data DPAR2 may comprise one or more parameters, which define the regression function.

The control unit CNT2 may be configured to scan the wavelength $\lambda_M$, when the mirror gap $d_F$ is kept constant. The control unit CNT2 may be configured to determine a sensor signal value $S_d$ associated with the known wavelength $\lambda_M$ when $\lambda_0 = \lambda_M$, e.g. by monitoring when the transmitted intensity reaches a maximum.

The method may comprise:
  assembling a Fabry-Perot interferometer 300, which comprises the a first mirror plate 100 and a second mirror plate 200, wherein the mirror plates comprise electrodes, which form a sensor capacitor whose capacitance $C_d$ depends on the mirror gap $d_F$,
  coupling narrowband light LB11 through the Fabry-Perot interferometer 300 to a detector DET1,
  varying the wavelength $\lambda_M$ of the narrowband light LB11 and/or varying the mirror gap $d_F$, and
  monitoring the intensity of light transmitted through the Fabry-Perot interferometer 300.

The narrowband calibration light LB11 may also be e.g. a laser beam. The calibration light LB11 may be provided e.g. by a laser.

Figure 12:
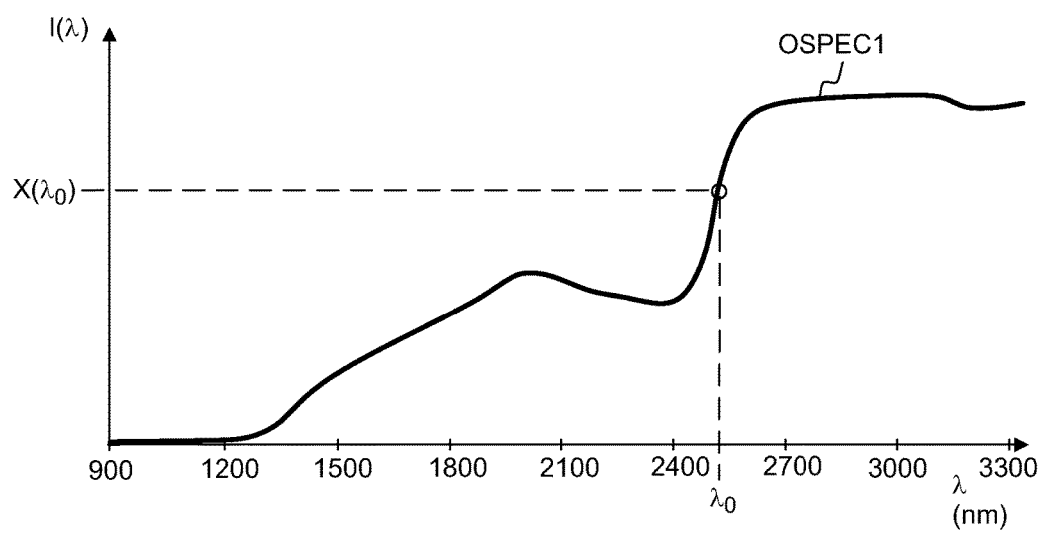
FIG. 12 shows, by way of example, measuring the spectrum of an object.

FIG. 12 shows, by way of example, the spectral intensity $I(\lambda)$ of light LB1 received from an object OBJ1. In particular, the curve OSPEC1 may represent the spectral intensity $I(\lambda)$ of light LB1 received from a certain point of the object OBJ1. The spectral intensity $I(\lambda)$ may have a value $X(\lambda_0)$ at a wavelength $\lambda_0$. The value $X(\lambda_0)$ may be determined from the detector signal $S_R$ obtained from the optical detector 600. The wavelength $\lambda_0$ may be selected by adjusting the mirror gap $d_F$ before the detector signal $S_R$ is obtained from the optical detector 600. The mirror gap $d_F$ may be scanned during a measurement in order to measure spectral range of the spectrum OSPEC1 of the object OBJ1. The mirror gap $d_F$ may be scanned during a measurement in order to measure a wider spectrum of the object OBJ1.

The object OBJ1 may be e.g. a real object or a virtual object. A real object OBJ1 may be e.g. in solid, liquid, or gaseous form. The real object OBJ1 may be a cuvette filled with a gas. The real object OBJ1 may be e.g. a plant (e.g. tree or a flower), a combustion flame, or an oil spill floating on water. The real object OBJ1 may be e.g. the sun or a star observed through a layer of absorbing gas. The real object may be e.g. an image printed on a paper. A virtual object OBJ1 may be e.g. an optical image formed by another optical device.

The interferometer 300 may be suitable for filtering and/or analyzing infrared light. The materials and the dimensions of the mirror plate 100 may be selected such that a Fabry Perot interferometer 300 comprising the mirror plate 100 may be applicable for spectral analysis of infrared light.

The Fabry-Perot interferometer may be used as an optical filter, which has a variable mirror gap. An optical device may comprise one or more Fabry-Perot interferometers. The optical device may be e.g. a non-imaging spectrometer, an imaging spectrometer, a chemical analyzer, a biomedical sensor, and/or a component of a telecommunication system. The Fabry-Perot interferometer may comprise one or more actuators 301 for adjusting the mirror gap $d_F$.

For example, a spectrometer 700 comprising the mirror plate 100 may be arranged to measure the concentration of a gas by monitoring optical absorption in the infrared region. For example, a spectrometer 700 comprising the mirror plate 100 may be arranged to determine spectral data from human tissue or from animal tissue, e.g. in order to detect cancer or another abnormal condition.

The term "plate" may refer to a body, which has one or more substantially planar portions. The plate may have a first substantially planar portion so as to minimize wavefront distortion of light transmitted and/or reflected by said planar portion. The plate may optionally have a second substantially planar portion, so as to minimize wavefront distortion of light transmitted through the first substantially planar portion and the second substantially planar portion. The first planar portion may cover the entire top surface of the plate, or the first planar portion may cover less than 100% of the top surface of the plate. The second planar portion may cover the entire bottom surface of the plate, or the second planar portion may cover less than 100% of the bottom surface of the plate. The plate may optionally have e.g. one or more protruding portions and/or recessed portions (see e.g. the recessed portion 81 in FIG. 10*a*). In an embodiment, first planar portion may be substantially parallel to the second planar portion. In an embodiment, first planar portion and the second planar portion may define a non-zero wedge angle e.g. in order to reduce unwanted reflections.

In an embodiment, the passivated regions 70*a*, 70*b* may also comprise one or more additional insulating layers, in addition to the region 70*a*, 70*b* of passivated porous silicon. For example, the passivated region 70*a* may comprise the region 70*a* of passivated porous silicon and a layer of silica $SiO_2$ implemented on top of the region 70*a*. The sensor electrode G1*a* may be formed on top of the uppermost insulating layer of the passivated region 70*a*.

The passivated region 70*a* may be formed by etching a plurality of voids E1 in the substrate 50 such that the total surface area of the voids E1 is e.g. greater than 5 times, greater than 10 times, or even greater than 100 times the projected area of the passivated region 70*a*. The surfaces of the voids E1 may be passivated after the etching so as to form the passivated region 70*a*.

For the person skilled in the art, it will be clear that modifications and variations of the devices and methods according to the present invention are perceivable. The figures are schematic. The particular embodiments described above with reference to the accompanying drawings are illustrative only and not meant to limit the scope of the invention, which is defined by the appended claims.

The invention claimed is:

1. A method for producing a mirror plate for a Fabry-Perot interferometer, the method comprising:
   providing a substrate, which comprises silicon,
   implementing a semi-transparent reflective coating on the substrate,
   forming a passivated region in and/or on the substrate by etching a plurality of voids in the substrate, and by passivating the surfaces of the voids,
   forming a first sensor electrode on top of the passivated region, and
   forming a second sensor electrode supported by the substrate,
   wherein the total surface area of the voids is greater than 5 times the projected area of the passivated region.

2. The method of claim 1, wherein forming the passivated region comprises:
   forming a plurality of voids in the substrate by etching, and
   forming insulating material on the surfaces of the voids.

3. The method according to claim 1, wherein forming the passivated region comprises:
   forming a plurality of voids in the substrate by etching, and
   oxidizing the surfaces of the voids.

4. The method according to claim 1, wherein forming the passivated region comprises:
   forming a plurality of voids in the substrate by etching, and
   depositing insulating material on the surfaces of the voids.

5. The method according to claim 1, wherein the passivated region comprises passivated porous silicon, and forming the passivated region comprises:
   converting silicon into porous silicon by etching, and
   passivating surfaces of the pores of the porous silicon.

6. The method according to claim 1, wherein the inner widths of the voids are smaller than 100 μm in a transverse direction.

7. The method according to claim 1, wherein the widths of the walls between the voids are smaller than 100 μm in a transverse direction.

8. The method according to claim 1, wherein the voids are grooves, holes, channels and/or pores.

9. The method according to claim 1, wherein the thickness of the passivated region is greater than 10 μm.

10. The method according to claim 1, wherein the electrical conductivity of the passivated region is lower than 20% of the electrical conductivity of the silicon of the substrate at the temperature of 25° C.

11. A mirror plate for a Fabry-Perot interferometer, the mirror plate comprising:
   a substrate, which comprises silicon,
   a semi-transparent reflective coating implemented on the substrate, a passivated region comprising a passivated three-dimensional structure formed in and/or on the substrate by etching and passivation, a first sensor electrode formed on top of the passivated region, and a second sensor electrode supported by the substrate, wherein the thickness of the passivated region has been selected such that the thermally induced change of reactance between the first sensor electrode and the second sensor electrode is smaller that 0.1% of a reference value when the temperature of the substrate is changed by 1° C. wherein the reactance is determined at the frequency of 10 kHz, and the reference value is calculated according to the following equation:

$$X_{REF} = \frac{1}{2\pi \cdot 10 \text{ kHz} \cdot \left(\frac{\varepsilon \cdot A}{50 \text{ μm}}\right)}$$

where ε denotes the dielectric permittivity of vacuum, and A denotes the area of the first sensor electrode.

12. The mirror plate of claim 11 wherein the passivated region comprises passivated porous silicon.

13. The mirror plate of claim 11, wherein the passivated region comprises a conformally coated microstructured silicon matrix.

14. A Fabry-Perot interferometer, which comprises a first mirror plate and a second mirror plate, the first mirror plate comprising:

a substrate, which comprises silicon (Si), a semi-transparent reflective coating implemented on the substrate, a passivated region comprising a passivated three-dimensional structure formed in and/or on the substrate by etching and passivation, a first sensor electrode formed on top of the passivated region, and a second sensor electrode supported by the substrate, the second mirror plate comprising a third sensor electrode and a fourth sensor electrode such that the first sensor electrode and the third sensor electrode form a first sensor capacitor, the second sensor electrode and the fourth sensor electrode form a second sensor capacitor, the capacitance of the first sensor capacitor is indicative of the mirror gap of the Fabry-Perot interferometer.

15. The interferometer of claim 14 wherein the thickness of the passivated region has been selected such that thermally induced relative change of reactance (between the first sensor electrode and the second sensor electrode is smaller than 0.1% when the temperature of the substrate is changed by 1° C.

16. The interferometer of claim 14 comprising a plurality of sensor electrodes, which are arranged to monitor the alignment of the second mirror plate with respect to the first mirror plate.

17. A method for producing a mirror plate for a Fabry-Perot interferometer, the method comprising:

providing a substrate, which comprises silicon, implementing a semi-transparent reflective coating on the substrate, forming a passivated region in and/or on the substrate by etching a plurality of voids in the substrate, and by passivating the surfaces of the voids, forming a first sensor electrode on top of the passivated region, and forming a second sensor electrode supported by the substrate, wherein the electrical conductivity of the passivated region is lower than 20% of the electrical conductivity of the silicon of the substrate at the temperature of 25° C.

18. The method of claim 17, wherein the inner widths of the voids are smaller than 100 μm in a transverse direction.

19. The method of claim 17, wherein the widths of the walls between the voids are smaller than 100 μm in a transverse direction.

20. The method of claim 17, wherein the thickness of the passivated region is greater than 10 μm.

* * * * *